US012805121B2

(12) United States Patent
Jung et al.

(10) Patent No.: US 12,805,121 B2
(45) Date of Patent: Nov. 17, 2026

(54) DISPLAY DEVICE AND METHOD OF MANUFACTURING THE SAME

(71) Applicant: Samsung Display Co., LTD., Yongin-si (KR)

(72) Inventors: Da Woon Jung, Yongin-si (KR); Su Bin Bae, Yongin-si (KR); Tae Wook Kang, Yongin-si (KR); Sang Gab Kim, Yongin-si (KR); Yun Jong Yeo, Yongin-si (KR); Yu Gwang Jeong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 470 days.

(21) Appl. No.: 18/229,766

(22) Filed: Aug. 3, 2023

(65) Prior Publication Data

US 2024/0121989 A1 Apr. 11, 2024

(30) Foreign Application Priority Data

Oct. 11, 2022 (KR) ........................ 10-2022-0130071
Dec. 7, 2022 (KR) ........................ 10-2022-0169817

(51) Int. Cl.

| | |
|---|---|
| ***H10K 59/122*** | (2023.01) |
| ***H10K 59/12*** | (2023.01) |
| ***H10K 59/38*** | (2023.01) |
| ***H10K 59/40*** | (2023.01) |

(52) U.S. Cl.

CPC ....... *H10K 59/122* (2023.02); *H10K 59/1201* (2023.02); *H10K 59/38* (2023.02); *H10K 59/40* (2023.02)

(58) Field of Classification Search

CPC .. H10K 59/122; H10K 59/1201; H10K 59/38; H10K 59/40; H10K 59/8791; H10K 59/8792

See application file for complete search history.

(56) References Cited

U.S. PATENT DOCUMENTS 9,923,175 B2 3/2018 Kim et al.
11,189,814 B2 * 11/2021 Kim .................... H10K 59/131
11,527,732 B1 * 12/2022 Chen ..................... H10K 30/82
(Continued)

FOREIGN PATENT DOCUMENTS

JP 2008135325 A 6/2008
WO 2022039890 A1 2/2022

OTHER PUBLICATIONS

Extended European Search Report mailed Mar. 20, 2024 in corresponding EP Application No. 23201862.2, 10 pages.

*Primary Examiner* — Kevin Quarterman

(74) *Attorney, Agent, or Firm* — CANTOR COLBURN LLP

(57) ABSTRACT

A display device includes: a first pixel electrode disposed in a first emission area, on a substrate; an insulating layer covering edges of the first pixel electrode; a first light-emitting layer disposed on the first pixel electrode and the insulating layer; a first common electrode disposed on the first light-emitting layer; banks disposed on the insulating layer and surrounding the first emission area; and a first organic pattern surrounding the first emission area, disposed on the banks, and including the same material as the first light-emitting layer. Side surfaces of each of the banks are spaced apart from side surfaces of the insulating layer.

10 Claims, 29 Drawing Sheets

(56) References Cited

U.S. PATENT DOCUMENTS

| | | | | |
|---|---|---|---|---|
| 11,610,954 | B1 * | 3/2023 | Lin | H10K 59/122 |
| 12,349,578 | B2 * | 7/2025 | Liu | H10K 59/122 |
| 2022/0077251 | A1 | 3/2022 | Choung et al. | |
| 2022/0077257 | A1 | 3/2022 | Choung et al. | |
| 2022/0208943 | A1 | 6/2022 | Aoki et al. | |

* cited by examiner

DISPLAY DEVICE AND METHOD OF MANUFACTURING THE SAME

This application claims priority to Korean Patent Application No. 10-2022-0130071, filed on Oct. 11, 2022, and Korean Patent Application No. 10-2022-0169817 filed on Dec. 7, 2022, and all the benefits accruing therefrom under 35 U.S.C. § 119, the contents of which in their entirety are herein incorporated by reference.

BACKGROUND

1. Field

The present disclosure relates to a display device and a method of manufacturing the same.

2. Description of the Related Art

As the information society has developed, the demand for display devices for displaying images has diversified. For example, display devices have been applied to various electronic devices such as smart phones, digital cameras, notebook computers, navigation systems, and smart televisions. Examples of display devices include flat panel display devices such as a liquid crystal display ("LCD") device, a field emission display ("FED") device, or an organic light-emitting diode ("OLED") display device. The OLED display device, in particular, includes light-emitting elements, which can allow pixels of a display panel to emit light, and can thus display an image without the aid of a backlight unit that provides light to the display panel.

SUMMARY

Aspects of the present disclosure provide a display device and a method of manufacturing the same, which are capable of preventing defects in light-emitting elements and improving reliability by preventing common electrodes from being short-circuited in the process of forming the light-emitting elements in separate emission areas without performing a mask process.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment, a display device includes: a first pixel electrode disposed in a first emission area, on a substrate; an insulating layer covering edges of the first pixel electrode; a first light-emitting layer disposed on the first pixel electrode and the insulating layer; a first common electrode disposed on the first light-emitting layer; banks disposed on the insulating layer and surrounding the first emission area; and a first organic pattern surrounding the first emission area, disposed on the banks, and including the same material as the first light-emitting layer. Side surfaces of each of the banks are spaced apart from side surfaces of the insulating layer.

The banks may include: a first bank disposed on the insulating layer and including a metal material, a second bank disposed on the first bank, and a third bank disposed between the first bank and the insulating layer.

The side surfaces of the first bank may be inwardly recessed from the side surfaces of the second bank and the side surfaces of the third bank.

The second bank may include tips protruding from the side surfaces of the first bank toward the first emission area.

The first common electrode may extend to the side surfaces of each of the banks and may be in contact with the side surfaces of the first bank and a top surface of the third bank.

The display device may further include: a second pixel electrode disposed in a second emission area, on the substrate; a second light-emitting layer disposed on the second pixel electrode; and a second common electrode disposed on the second light-emitting layer.

The first and second common electrodes may be electrically connected through the first bank and third bank.

The banks may include: a first bank disposed on the insulating layer and including a metal material, and a second bank disposed on the first bank.

The side surfaces of the first bank may be inwardly recessed from the side surfaces of the second bank.

The display device may further include: a second pixel electrode disposed in a second emission area, on the substrate, a second light-emitting layer disposed on the second pixel electrode, and a second common electrode disposed on the second light-emitting layer. The first and second common electrodes may be electrically connected through the first bank.

According to an embodiment, a method of manufacturing a display device includes: forming first and second pixel electrodes on a substrate, sequentially depositing a sacrificial layer, an insulating layer, a third bank, a first bank, and a second bank on the first and second pixel electrodes, forming a first photoresist on the second bank not to overlap with the first pixel electrode in a plan view, etching the second bank, the first bank, and the third bank using the first photoresist as a mask, forming a second photoresist to cover side surfaces of each of the first bank, the second bank, and third bank, and etching the insulating layer using the second photoresist as a mask.

The method may further include, after the etching of the insulating layer, etching the sacrificial layer using the second photoresist as a mask, and exposing the first pixel electrode.

The method may further include, after the exposing of the first pixel electrode, forming a first light-emitting layer on the first pixel electrode and forming a first organic pattern on the second bank, forming a first common electrode on the first light-emitting layer and forming a first electrode pattern on the first organic pattern, forming a capping layer on the first common electrode and forming a first capping pattern on the first electrode pattern, and forming a first inorganic layer, which covers the capping layer, the first capping pattern and the side surfaces of the first bank.

The etching of the second bank, the first bank, and the third bank may include inwardly recessing the side surfaces of the first bank from the side surfaces of each of the second bank and third bank.

The method may further include, after the etching of the insulating layer, removing the second photoresist and etching the sacrificial layer and the side surfaces of the first bank.

According to an embodiment, a method of manufacturing a display device includes: forming first and second pixel electrodes on a substrate, sequentially depositing a sacrificial layer, an insulating layer, a first bank, and a second bank on the first and second pixel electrodes, forming a first photoresist on the second bank not to overlap with the first pixel electrode in a plan view, etching the second bank and the first bank using the first photoresist as a mask, forming a second photoresist to cover side surfaces of each of the first bank and second bank, and etching the insulating layer using the second photoresist as a mask.

The method may further include, after the etching of the insulating layer, etching the sacrificial layer using the second photoresist as a mask, and exposing the first pixel electrode.

The method may further include, after the exposing of the first pixel electrode, forming a first light-emitting layer on the first pixel electrode and forming a first organic pattern on the second bank, forming a first common electrode on the first light-emitting layer and forming a first electrode pattern on the first organic pattern, forming a capping layer on the first common electrode and forming a first capping pattern on the first electrode pattern, and forming a first inorganic layer, which covers the capping layer, the first capping pattern and the side surfaces of the first bank.

The etching of the second bank and the first bank, may include inwardly recessing the side surfaces of the first bank from the side surfaces of the second bank.

The method may further include, after the etching of the insulating layer, removing the second photoresist and etching the sacrificial layer and the side surfaces of the first bank.

According to the aforementioned and other embodiments of the present disclosure, as banks are etched using a first photoresist as a mask and an insulating layer, which covers side surfaces of each of the banks, is etched using a second photoresist as a mask, the insulating layer can have inclined side surfaces, and relatively thin residual patterns can be provided. Also, as common electrodes can be prevented from being short-circuited, defects in light-emitting elements can be prevented, and reliability can be effectively improved.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
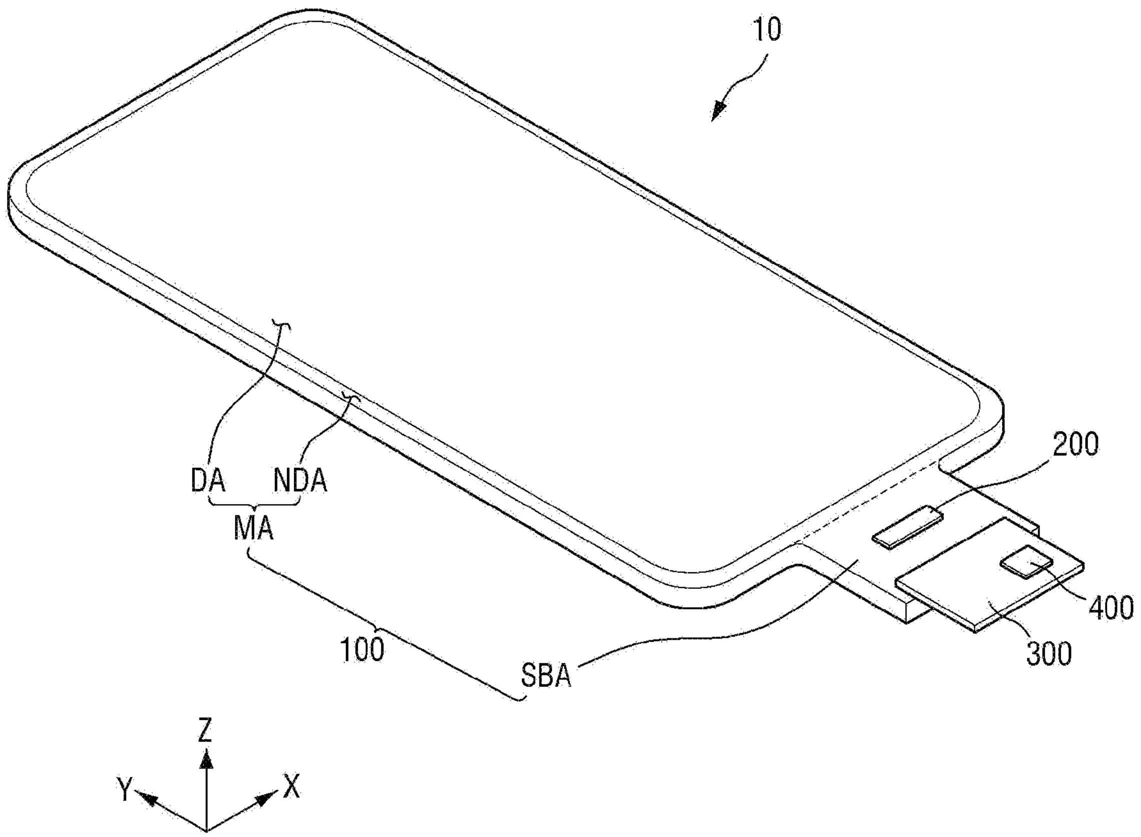
FIG. 1 is a perspective view of a display device according to an embodiment of the present disclosure.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive nor limit the disclosure. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XY, YZ, XZ, or the like. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to other element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, detailed embodiments of the disclosure is described with reference to the accompanying drawings.

FIG. 1 is a perspective view of a display device according to an embodiment of the present disclosure.

Referring to FIG. 1, a display device 10 may be applicable to a mobile electronic device such as a mobile phone, a smartphone, a tablet personal computer ("PC"), a mobile communication terminal, an electronic notepad, an electronic-book reader, a portable multimedia player ("PMP"), a navigation system, or an ultra-mobile PC ("UMPC"). For example, the display device 10 may be applicable as the display unit of a television ("TV") or a notebook computer, a monitor, an electronic billboard, or an Internet-of-Things ("IoT") device. In another example, the display device may be applicable to a wearable device such as a smartwatch, a watchphone, a glasses display, or a head-mounted display ("HMD").

The display device 10 may have an almost rectangular in a plan view. Here, the "plan view" is a view in the thickness direction (a Z-axis direction). For example, the display device 10 may have an almost rectangular shape having short sides extending in an X-axis direction and long sides extending in a Y-axis direction. The corners where the short sides and the long sides of the display device 10 meet may be rounded to have a predetermined curvature or may be right-angled. The shape of the display device 10 is not particularly limited, and the display device 10 may be formed in various other shapes such as another polygonal shape, a circular shape, or an elliptical shape.

The display device 10 may include a display panel 100, a display driver 200, a circuit board 300, and a touch driver 400.

The display panel 100 may include a main area MA and a subarea SBA.

The main area MA may include a display area DA, which includes pixels for displaying an image, and a non-display area NDA, which is disposed around the display area DA. The display area DA may emit light through a plurality of emission areas or openings. For example, the display panel 100 may include pixel circuits including switching elements, a pixel-defining film defining the emission areas or the openings, and self-light-emitting elements.

For example, the self-light-emitting elements may include organic light-emitting diodes (OLEDs), quantum-dot light-emitting diodes (LEDs) including a quantum-dot light-emitting layer, inorganic LEDs including an inorganic semiconductor, and/or micro LEDs, but the present disclosure is not limited thereto.

The non-display area NDA may be on the outside of the display area DA. The non-display area NDA may be defined as an edge part of the main area MA. The non-display area NDA may include a gate driver (not illustrated) providing gate signals to gate lines and fan-out lines (not illustrated) connecting the display driver 200 and the display area DA.

The subarea SBA may extend from one side of the main area MA. The subarea SBA may include a flexible material that is bendable, foldable, or rollable. For example, in a case where the subarea SBA is bendable, the subarea SBA may be bent to overlap with the main area MA in a thickness direction (a Z-axis direction). The subarea SBA may include the display driver 200 and a pad unit, which is connected to the circuit board 300. The subarea SBA may be optional, and the display driver 200 and the pad unit may be disposed in the non-display area NDA.

The display driver 200 may output signals and voltages for driving the display panel 100. The display driver 200 may provide data voltages to data lines. The display driver 200 may provide power supply voltages to power supply lines and may provide gate control signals to the gate driver. The display driver 200 may be formed as an integrated circuit ("IC") and may be mounted on the display panel 100 in a chip-on-glass ("COG") or chip-on-plastic ("COP") manner or via ultrasonic bonding. For example, the display driver 200 may be disposed in the subarea SBA and may overlap with the main area MA in the thickness direction (or the Z-axis direction) when the subarea SBA is bent. In another example, the display driver 200 may be mounted on the circuit board 300.

The circuit board 300 may be attached to the pad unit of the display panel 100 via an anisotropic conductive film ("ACF"). Lead lines of the circuit board 300 may be electrically connected to the pad unit of the display panel 100. The circuit board 300 may be a printed circuit board ("PCB"), a flexible PCB ("FPCB"), or a flexible film such as a chip-on-film ("COF").

The touch driver 400 may be mounted on the circuit board 300. The touch driver 400 may be electrically connected to a touch sensing unit of the display panel 100. The touch driver 400 may provide a touch driving signal to a plurality of touch electrodes of the touch sensing unit and may sense capacitance variations between the touch electrodes. For example, the touch driving signal may be a pulse signal having a predetermined frequency. The touch driver 400 may calculate the presence and coordinates of input based on the capacitance variations between the touch electrodes. The touch driver 400 may be formed as an integrated circuit (IC).

Figure 2:
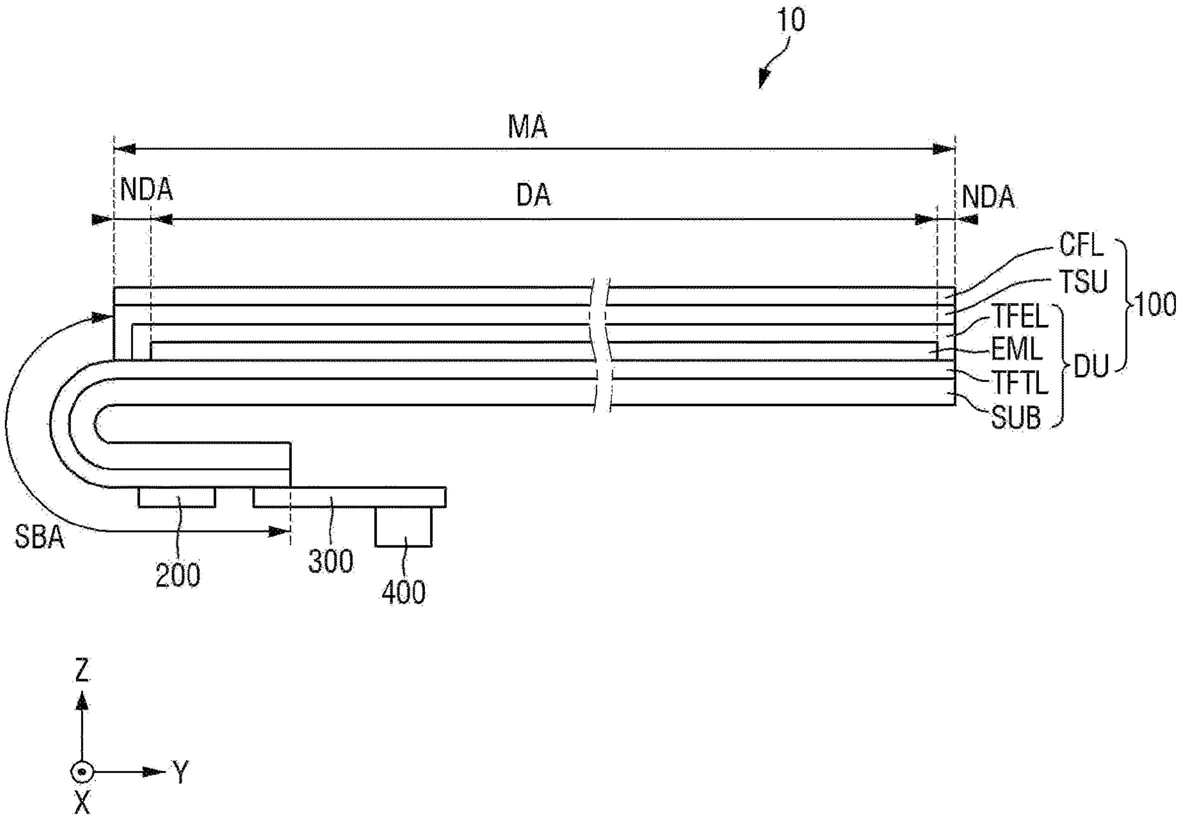
FIG. 2 is a cross-sectional view of the display device of FIG. 1.

FIG. 2 is a cross-sectional view of the display device of FIG. 1.

Referring to FIG. 2, the display panel 100 may include a display unit DU, a touch sensing unit TSU, and a color filer layer CFL. The display unit DU may include a substrate SUB, a thin-film transistor layer TFTL, a light-emitting element layer EML, and an encapsulation layer TFEL.

The substrate SUB may be a base substrate or a base member. The substrate SUB may be a flexible substrate that is bendable, foldable, or rollable. For example, the substrate SUB may include a polymer resin such as polyimide ("PI"), but the present disclosure is not limited thereto. In another example, the substrate SUB may include a glass material or a metal material.

The TFT layer TFTL may be disposed on the substrate SUB. The TFT layer TFTL may include a plurality of TFTs that form the pixel circuitry of pixels. The TFT layer TFTL may further include gate lines, data lines, power lines, gate control lines, and fan-out lines connecting the display driver 200 and the data lines, and lead lines connecting the display driver 200 and the pad unit. The TFTs may include semiconductor regions, source electrodes, drain electrodes, and gate electrodes. For example, in a case where the gate driver is formed on one side of the non-display area NDA of the display panel 100, the gate driver may include TFTs.

The TFT layer TFTL may be disposed in the display area DA, the non-display area NDA, and the subarea SBA. The TFTs, the gate lines, the data lines, and the power lines of the TFT layer TFTL may be disposed in the display area DA. The gate control lines and the fan-out lines of the TFT layer TFTL may be disposed in the non-display area NDA. The lead lines of the TFT layer TFTL may be disposed in the subarea SBA.

The light-emitting element layer EML may be disposed on the TFT layer TFTL. The light-emitting element layer EML may include a plurality of light-emitting elements, in which pixel electrodes, light-emitting layers, and common electrodes are sequentially stacked to emit light, and a pixel-defining film, which defines the pixels. The light-emitting elements of the light-emitting element layer EML may be disposed in the display area DA.

For example, the light-emitting layers may be organic light-emitting layers including an organic material. The light-emitting layers may include hole transport layers, organic light-emitting layers, and electron transport layers. As the pixel electrodes receive a voltage through the TFTs of the TFT layer TFTL and the common electrodes receive a cathode voltage, holes and electrons may move to the organic emission layers through the hole transport layers and the electron transport layers, respectively, and may combine together in the organic light-emitting layers to emit light. For example, the pixel electrodes may be anodes, and the common electrodes may be cathodes. However, the present disclosure is not limited to this example.

Alternatively, the light-emitting elements may be quantum-dot light-emitting diodes (LEDs) including quantum-dot light-emitting layers, inorganic LEDs including an inorganic semiconductor, or micro-LEDs.

The encapsulation layer TFEL may cover the top surface and side surfaces of the light-emitting element layer EML and may protect the light-emitting element layer EML. The encapsulation layer TFEL may include at least one inorganic film and at least one organic film for encapsulating the light-emitting element layer EML.

The touch sensing unit TSU may be disposed on the encapsulation layer TFEL. The touch sensing unit TSU may include a plurality of touch electrodes for sensing touch input from a user in a capacitive manner and touch lines for connecting the touch electrodes and the touch driver 400.

For example, the touch sensing unit TSU may sense touch input from the user in a mutual capacitance manner or in a self-capacitance manner.

In another example, the touch sensing unit TSU may be disposed on a separate substrate on the display unit DU. In this example, the substrate supporting the touch sensing unit TSU may be a base member for encapsulating the display unit DU.

The touch electrodes of the touch sensing unit TSU may be disposed in a touch sensor area, which overlaps with the display area DA. The touch lines of the touch sensing unit TSU may be disposed in a touch peripheral area, which overlaps with the non-display area NDA.

The color filter layer CFL may be disposed on the touch sensing unit TSU. The color filter layer CFL may include a plurality of color filters, which correspond to a plurality of emission areas. Each of the color filters may selectively transmit light of a particular wavelength therethrough and may block or absorb light of other wavelengths. The color filter layer CFL may absorb some of light introduced into the display device 10 from the outside and may thus reduce reflected light of external light. Accordingly, the color filter layer CFL can prevent any color distortions that may be caused by the reflection of external light.

As the color filter layer CFL is disposed directly on the touch sensing unit TSU, the display device 10 may not need a separate substrate for the color filter layer CFL. Accordingly, the thickness of the display device 10 can be reduced.

The subarea SBA of the display panel 100 may extend from one side of the main area MA of the display panel 100. The subarea SBA may include a flexible material that allows the subarea SBA to be bendable, foldable, or rollable. For example, the subarea SBA may be bent to overlap with the main area MA in the thickness direction (or the Z-axis direction). The subarea SBA may include the display driver 200 and the pad unit, which is electrically connected to the circuit board 300.

Figure 3:
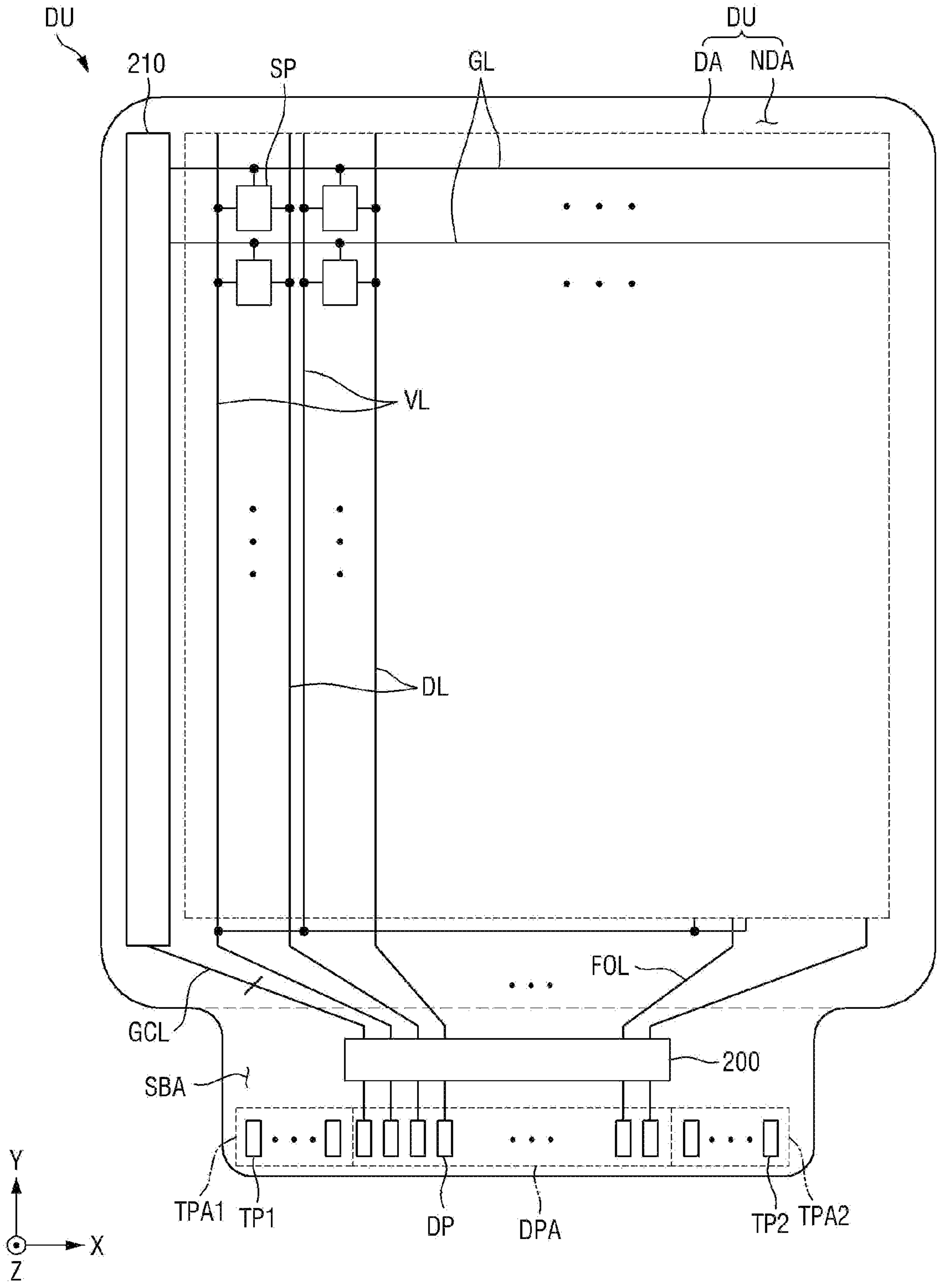
FIG. 3 is a plan view of a display unit of the display device of FIG. 1.

FIG. 3 is a plan view of the display layer of the display device of FIG. 1.

Referring to FIG. 3, the display unit DU may include the display area DA and the non-display area NDA.

The display area DA, which displays an image, may be defined as a middle area of the display panel 100. The display area DA may include a plurality of pixels SP, a plurality of gate lines GL, a plurality of data lines DL, and a plurality of power supply lines VL. The pixels SP may be defined as minimal units for emitting light.

The gate lines GL may provide gate signals received from the gate driver 210 to the pixels SP. The gate lines GL may extend in the X-axis direction and may be spaced apart from one another in the Y-axis direction, which intersects the X-axis direction The data lines DL may provide data voltages received from the display driver 200 to the pixels SP. The data lines DL may extend in the Y-axis direction and may be spaced apart from one another in the X-axis direction.

The power supply lines VL may provide the power supply voltages received from the display driver 200 to the pixels SP. Here, the power supply voltages include a driving voltage, an initialization voltage, a reference voltage, and/or a low-potential voltage. The power supply lines VL may extend in the Y-axis direction and may be spaced apart from one another in the X-axis direction.

The non-display area NDA may surround the display area DA. The non-display area NDA may include the gate driver 210, fan-out lines FOL, and gate control lines CGL. The gate driver 210 may generate a plurality of gate signals based on the gate control signals and may sequentially provide the gate signals to the gate lines GL in a predefined order.

The fan-out lines FOL may extend from the display driver 200 to the display area DA. The fan-out lines FOL may provide data voltages received from the display driver 200 to the data lines DL.

The gate control lines CGL may extend from the display driver 200 to the gate driver 210. The gate control lines GCL may provide gate control signals received from the display driver 200 to the gate driver 210.

The subarea SBA may include the display driver 200, a display pad area DPA, and first and second touch areas TPA1 and TPA2.

The display driver 200 may output signals and voltages for driving the display panel 100 to the fan-out lines FOL. The display driver 200 may provide data voltages to the data lines DL through the fan-out lines FOL. The data voltages may be provided to the pixels SP and may determine the luminance of the pixels SP. The display driver 200 may provide gate control signals to the gate driver 210 through the gate control lines GCL.

The display pad area DPA, a first touch pad area TPA1, and a second touch pad area TPA2 may be disposed on an edge of the subarea SBA. The display pad area DPA, the first touch pad area TPA1, and the second touch pad area TPA2 may be electrically connected to the circuit board 300 via a low-resistance, high-reliability material such as an anisotropic conductive film ("ACF") or a self-assembly anisotropic conductive paste ("SAP").

The display pad area DPA may include a plurality of display pads DP. The display pads DP may be electrically connected to a graphics system via the circuit board 300. The display pads DP may be connected to the circuit board 300 and may thus receive digital video data and provide the digital video data to the display driver 200.

The first touch pad area TPA1 may be disposed on one side of the display pad area DPA and may include a plurality of first touch pads TP1. The first touch pads TP1 may be electrically connected to the touch driver 400, which is disposed on the circuit board 300. The first touch pads TP1 may provide touch driving signals to a plurality of driving electrodes via a plurality of driving lines.

The second touch pad area TPA2 may be disposed on the other side of the display pad area DPA and may include a plurality of second touch pads TP2. The second touch pads TP2 may be electrically connected to the touch driver 400, which is disposed on the circuit board 300. The touch driver 400 may receive touch sensing signals via a plurality of sensing lines connected to the second touch pads TP2 and may sense variations in mutual capacitance between the driving electrodes and sensing electrodes.

Figure 4:
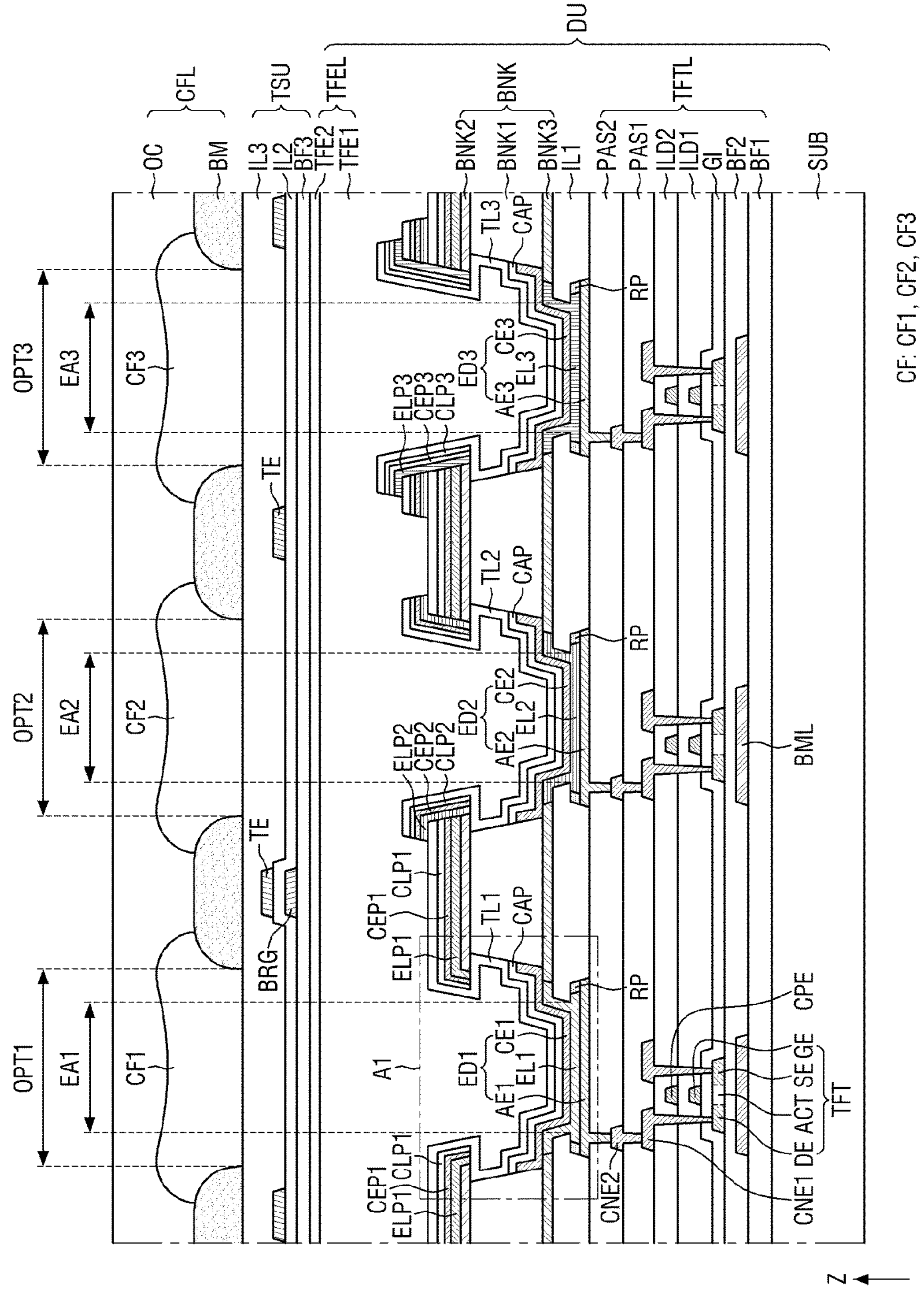
FIG. 4 is a cross-sectional view illustrating part of the display device of FIG. 1.
Figure 5:
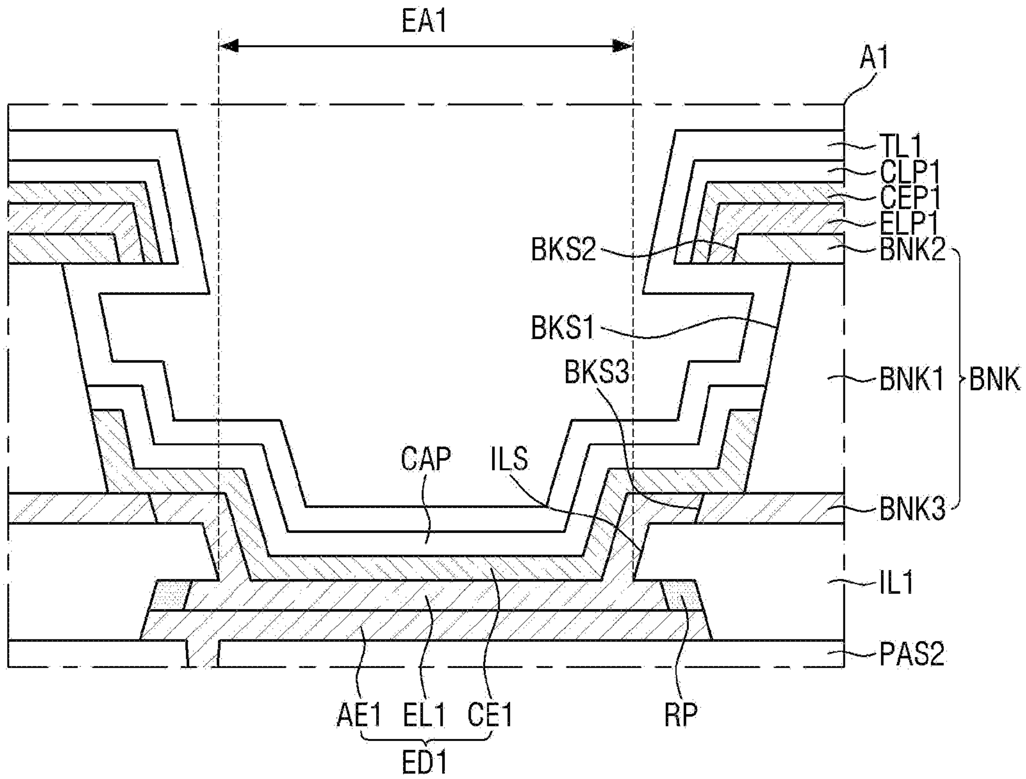
FIG. 5 is an enlarged cross-sectional view of an area A1 of FIG. 4.

FIG. 4 is a cross-sectional view illustrating part of the display device of FIG. 1, and FIG. 5 is an enlarged cross-sectional view of an area A1 of FIG. 4.

Referring to FIGS. 4 and 5, the display panel 100 of the display device 10 may include the display unit DU, the touch sensing unit TSU, and the color filter layer CFL. The display unit DU may include the substrate SUB, the TFT layer TFTL, the light-emitting element layer EML, and the encapsulation layer TFEL.

The substrate SUB may be a base substrate or a base member. The substrate SUB may be a flexible substrate that is bendable, foldable, or rollable. For example, the substrate SUB may include a polymer resin such as PI, but the present disclosure is not limited thereto. In another example, the substrate SUB may include a glass or metal material.

The TFT layer TFTL may include a first buffer layer BF1, a light-blocking layer BML, a second buffer layer BF2, thin-film transistors TFT, a gate insulating layer GI, a first interlayer-insulating layer ILD1, capacitor electrodes CPE, a second interlayer-insulating layer ILD2, first connection electrodes CNE1, a first passivation layer PAS1, second connection electrodes CNE2, and a second passivation layer PAS2.

The first buffer layer BF1 may be disposed on the substrate SUB. The first buffer layer BF1 may include an inorganic film capable of preventing the infiltration of the air or moisture. For example, the first buffer layer BF1 may include a plurality of inorganic films that are alternately stacked.

The light-blocking layer BML may be disposed on the first buffer layer BF1. For example, the light-blocking layer BML may be formed as a single layer or a multilayer including molybdenum (Mo), aluminum (Al), chromium (Cr), gold (Au), titanium (Ti), nickel (Ni), neodymium (Nd), copper (Cu), or an alloy thereof, but the present disclosure is not limited thereto. In another example, the light-blocking layer BML may be an organic film including a black pigment.

The second buffer layer BF2 may be disposed on the first buffer layer BF1 and the light-blocking layer BML. The second buffer layer BF2 may include an inorganic film capable of preventing the infiltration of the air or moisture. For example, the second buffer layer BF2 may include a plurality of inorganic films that are alternately stacked.

The thin-film transistors TFT may be disposed on the second buffer layer BF2 and may form the pixel circuitry of a plurality of pixels. For example, the thin-film transistors TFT may be driving transistors or switching transistors. The thin-film transistors TFT may include semiconductor regions ACT, source electrodes SE, drain electrodes DE, and gate electrodes GE.

The semiconductor regions ACT, the source electrodes SE, and the drain electrodes DE may be disposed on the second buffer layer BF2. The semiconductor regions ACT, the source electrodes SE, and the drain electrodes DE may overlap with the light-blocking layer BML in the thickness direction. The semiconductor regions ACT may overlap with the gate electrodes GE in the thickness direction and may be insulated from the gate electrodes GE by the gate insulating layer GI. The source electrodes SE and the drain electrodes DE may be obtained by turning the material of the semiconductor regions ACT into conductors.

The gate electrodes GE may be disposed on the gate insulating layer GI. The gate electrodes GE may overlap with the semiconductor regions ACT with the gate insulating layer GI interposed therebetween.

The gate insulating layer GI may be disposed on the semiconductor regions ACT, the source electrodes SE, and the drain electrodes DE. For example, the gate electrodes GE may cover the semiconductor regions ACT, the source electrodes SE, and the drain electrodes DE and the second buffer layer BF2 and may insulate the semiconductor regions ACT and the gate electrodes GE.

A first interlayer-insulating layer ILD1 may be disposed on the gate electrodes GE and the gate insulating layer GI. The first interlayer-insulating layer ILD1 may insulate the gate electrodes GE and the capacitor electrodes CPE.

The capacitor electrodes CPE may be disposed on the first interlayer-insulating layer ILD1. The capacitor electrodes CPE may overlap with the gate electrodes GE in the thickness direction. The capacitor electrodes CPE and the gate electrodes GE may form capacitors.

The second interlayer-insulating layer ILD2 may be disposed on the capacitor electrodes CPE and the first interlayer-insulating layer ILD1. The second interlayer-insulating layer ILD2 may insulate the capacitor electrodes CPE and the first connection electrodes CNE1

The first connection electrodes CNE1 may be disposed on the second interlayer-insulating layer ILD2. The first connection electrodes CNE1 may electrically connect the drain electrodes DE of the thin-film transistors TFT and the second connection electrodes CNE2. The first connection electrodes CNE1 may be inserted in the contact holes of each of the second interlayer-insulating layer ILD2, the first interlayer-insulating layer ILD1, and the gate insulating layer GI and may thus be in contact with the drain electrodes DE of the thin-film transistors TFT.

The first passivation layer PAS1 may be disposed on the first connection electrodes CNE1 and the second interlayer-insulating layer TLD2. The first passivation layer PAS1 may protect the thin-film transistors TFT. The first passivation layer PAS1 may insulate the first connection electrodes CNE1 and the second connection electrodes CNE2.

The second connection electrodes CNE2 may be disposed on the first passivation layer PAS1. The second connection electrodes CNE2 may electrically connect the first connection electrodes CNE1 and first pixel electrode AEL of first light-emitting element ED1. The second connection electrodes CNE2 may be inserted in the contact holes of the first passivation layer PAS1 and may thus be in contact with the first connection electrodes CNE1.

The second passivation layer PAS2 may be disposed on the second connection electrodes CNE2 and the first passivation layer PAS1.

The light-emitting element layer EML may be disposed on the TFT layer TFTL. The light-emitting element layer EML may include the first, second, and third light-emitting elements ED1, ED2, and ED3, residual patterns RP, a first insulating layer IL1, a capping layer CAP, banks BNK, first, second, and third organic patterns ELP1, ELP2, and ELP3, first, second, and third electrode patterns CEP1, CEP2, and CEP3, first, second, and third capping patterns CLP1, CLP2, and CLP3, and first, second, and third inorganic layers TL1, TL2, and TL3.

The display device 10 may include a plurality of pixels, which are arranged in multiple rows and multiple columns. Each of the pixels may include first, second, and third emission areas EA1, EA2, and EA3, which are defined by the banks BNK or a pixel-defining film, and may emit light having predetermined peak wavelengths through the first, second, and third emission areas EA1, EA2, and EA3. The first, second, and third emission areas EA1, EA2, and EA3 may be areas that output light generated by the first, second, and third light-emitting elements ED1, ED2, and ED3 to the outside of the display device 10.

The first, second, and third emission areas EA1, EA2, and EA3 may each emit light having a predetermined peak wavelength to the outside of the display device 10. The first emission area EA1 may emit first-color light, the second emission area EA2 may emit second-color light, and the third emission area EA3 may emit third-color light. For example, the first-color light may be red light having a peak wavelength of about 610 nanometers (nm) to about 650 nm, the second-color light may be green light having a peak wavelength of about 510 nm to about 550 nm, and the third-color light may be blue light having a peak wavelength of about 440 nm to about 480 nm. However, the present disclosure is not limited to this example.

For example, the third emission area EA3 may be larger in size than the first emission area EA1, and the first emission area EA1 may be larger in size than the second emission area EA2. However, the present disclosure is not limited to this example. In another example, the first, second, and third emission areas EA1, EA2, and EA3 may have substantially the same size.

The first light-emitting element ED1 may be disposed in the first emission area EA1, on the TFT layer TFTL. The first light-emitting element ED1 may include the first pixel electrode AE1, a first light-emitting layer EL1, and a first common electrode CE1. The second light-emitting element ED2 may be disposed in the second emission area EA2, on the TFT layer TFTL. The second light-emitting element ED2 may include the second pixel electrode AE2, a second light-emitting layer EL2, and a second common electrode CE2. The third light-emitting element ED3 may be disposed in the third emission area EA3, on the TFT layer TFTL. The third light-emitting element ED3 may include the third pixel electrode AE3, a third light-emitting layer EL3, and a third common electrode CE3.

The first, second, and third pixel electrodes AE1, AE2, and AE3 may be disposed on the second passivation layer PAS2. The first, second, and third pixel electrodes AE1, AE2, and AE3 may be connected to the drain electrodes DE of the thin-film transistors TFT through the first connection electrodes CNE1 and the second connection electrodes CNE2. The first, second, and third pixel electrodes AE1, AE2, and AE3 may be insulated from one another by the first insulating layer IL1. For example, the first, second, and third pixel electrodes AE1, AE2, and AE3 may include at least one of Ag, Cu, Al, Ni, and lanthanum (La). In another example, the first, second, and third pixel electrodes AE1, AE2, and AE3 may include a material such as indium tin oxide ("ITO"), indium zinc oxide ("IZO"), or indium tin zinc oxide ("ITZO"). In yet another example, the first, second, and third pixel electrodes AE1, AE2, and AE3 may have a stack structure such as ITO/Ag/ITO/, ITO/Ag/IZO, or ITO/Ag/ITZO/IZO.

The first insulating layer IL1 may be disposed on the second passivation layer PAS2 and the residual patterns RP. The first insulating layer IL1 may cover the edges of each of the first, second, and third pixel electrodes AE1, AE2, and AE3 and the residual patterns RP and may expose parts of the top surfaces of the first, second, and third pixel electrodes AE1, AE2, and AE3. For example, the first insulating layer IL1 may expose the first pixel electrode AE1, in the first emission area EA1, and the first light-emitting layer EL1 may be disposed directly on the first pixel electrode AE1. The first insulating layer IL1 may include an inorganic insulating material. The first insulating layer IL1 may include at least one of a silicon nitride layer, a silicon oxynitride layer, a silicon oxide layer, a titanium oxide layer, an aluminum oxide layer, and an amorphous silicon layer, but the present disclosure is not limited thereto.

Referring to FIG. 5, the first insulating layer IL1 may have inclined side surfaces ILS. The first insulating layer IL1 may be etched from above, and the side surfaces ILS of the first insulating layer IL1 may face the top of the light-emitting element layer EML. The side surfaces ILS of the first insulating layer IL1 may be spaced apart from side surfaces of each of the banks BNK. The side surfaces ILS of the first insulating layer IL1 may be spaced apart from side surfaces BKS1 of a first bank BNK1, side surfaces BKS2 of a second bank BNK2, and side surfaces BKS3 of a third bank BNK3.

The first insulating layer IL1 and the banks BNK may be etched by separate etching processes. The first insulating layer IL1 and the banks BNK may be etched using different photoresists as masks. The banks BNK may be etched using a first photoresist as a mask, and the first insulating layer IL1 may be etched using a second photoresist as a mask. The first photoresist may cover the top surfaces of the banks BNK. The second photoresist may cover both the side surfaces and the top surface of each of the banks BNK and may protect the side surfaces of each of the banks BNK. The second photoresist may have a larger planar area than the first photoresist. For example, in a case where the first bank BNK1 includes aluminum (Al) and the first insulating layer IL1 is formed by dry etching, the second photoresist may prevent the first bank BNK1 from being plasma-oxidated. As the first insulating layer IL1 and the banks BNK are etched by separate etching processes, damage to the residual patterns RP can be controlled, and the display device 10 can include relatively thin residual patterns RP.

As the display device 10 includes the first insulating layer IL1 with the inclined side surfaces ILS and the relatively thin residual patterns RP, the first, second, and third common electrodes CE1, CE2, and CE3 can be prevented from being short-circuited. For example, the first common electrode CE1 may be disposed directly on the first light-emitting layer EL1, in the first emission area EA1, and may extend to the side surfaces of each of the banks BNK to be in contact with the side surfaces BKS1 of the first bank BNK1 and the top surface of the third bank BNK3. Thus, defects in the first, second, and third light-emitting elements ED1, ED2, and ED3 can be prevented, and reliability can be improved.

The residual patterns RP may be disposed on the edges of each of the first, second, and third pixel electrodes AE1, AE2, and AE3. The first insulating layer IL1 may not be in direct contact with the top surfaces of the first, second, and third pixel electrodes AE1, AE2, and AE3 due to the presence of the residual patterns RP. The residual patterns RP may be formed by removing a sacrificial layer ("SFL" of FIG. 6) from above the first, second, and third pixel electrodes AE1, AE2, and AE3 during the fabrication of the display device 10.

The first, second, and third light-emitting layers EL1, EL2, and EL3 may be organic light-emitting layers formed of an organic material and may be formed on the first, second, and third pixel electrodes AE1, AE2, and AE3, respectively, via a deposition process. For example, during the deposition of the first, second, and third light-emitting layers EL1, EL2, and EL3, an organic material may be deposited in a diagonal direction with respect to the top surface of the substrate SUB.

The first light-emitting layer EL1 may be disposed on the first pixel electrode AE1, in the first emission area EA1. Part of the first light-emitting layer EL1 may fill the space surrounded by the first pixel electrode AE1, the residual patterns RP, and the first insulating layer IL1, and another part of the first light-emitting layer EL1 may cover part of the top surface of the first insulating layer IL1 and some of the side surfaces ILS of the first insulating layer IL1. The second light-emitting layer EL2 may be disposed directly on the second pixel electrode AE2, in the second emission area EA2. Part of the second light-emitting layer EL2 may fill the space surrounded by the second pixel electrode AE2, the residual patterns RP, and the first insulating layer IL1, and another part of the second light-emitting layer EL2 may cover part of the top surface of the first insulating layer IL1 and some of the side surfaces ILS of the first insulating layer IL1. The third light-emitting layer EL3 may be disposed directly on the third pixel electrode AE3, in the third emission area EA3. Part of the third light-emitting layer EL3 may fill the space surrounded by the third pixel electrode AE3, the residual patterns RP, and the first insulating layer IL1, and another part of the third light-emitting layer EL3 may cover part of the top surface of the first insulating layer IL1 and some of the side surfaces ILS of the first insulating layer IL1.

The first common electrode CE1 may be disposed on the first light-emitting layer EL1, the second common electrode CE2 may be disposed on the second light-emitting layer EL2, and the third common electrode CE3 may be disposed on the third light-emitting layer EL3. The first, second, and third common electrodes CE1, CE2, and CE3 may include a transparent conductive material and may transmit light generated by the first, second, and third light-emitting layers EL1, EL2, and EL3 therethrough. The first, second, and third common electrodes CE1, CE2, and CE3 may be in contact with the side surfaces BKS1 of the first bank BNK1 and the top surface of the third bank BNK3 and may be electrically connected by the first and third banks BNK1 and BNK3. For example, the first common electrode CE1 may receive a common voltage or a low-potential voltage.

The first pixel electrode AE1 may receive a voltage corresponding to a data voltage from one of the thin-film transistors TFT, and the first common electrode CE1 may receive a common voltage or a cathode voltage. In this case, as a potential difference is generated between the first pixel electrode AE1 and the first common electrode CE1, holes and electrons move to the first light emitting layer EL1 through a hole transport layer and an electron transport layer, respectively, and as a result, the first light emitting layer EL1 emits light.

The capping layer CAP may be disposed on the first, second, and third common electrodes CE1, CE2, and CE3. The capping layer CAP may include an inorganic insulating material and may cover the first, second, and third common electrodes CE1, CE2, and CE3. The capping layer CAP may prevent the first, second, and third light emitting elements ED1, ED2, and ED3 from being damaged by external air. For example, the capping layer CAP may include at least one of a silicon nitride layer, a silicon oxynitride layer, a silicon oxide layer, a titanium oxide layer, an aluminum oxide layer, and an amorphous silicon layer, but the present disclosure is not limited thereto.

The banks BNK may be disposed on the first insulating layer IL1 to define the first, second, and third emission areas EA1, EA2, and EA3. The banks BNK may surround the first, second, and third emission areas EA1, EA2, and EA3 in a plan view. The banks BNK may include the first, second, and third banks BNK1, BNK2, and BNK3.

The third bank BNK3 may be disposed on the first insulating layer IL1, the first bank BNK1 may be disposed on the third bank BNK3, and the second bank BNK2 may be disposed on the first bank BNK1. Referring to FIG. 5, the side surfaces BKS1 of the first bank BNK1, the side surfaces BKS2 of the second bank BNK2, and the side surfaces BKS3 of the third bank BNK3 may be spaced apart from the side surfaces ILS of the first insulating layer IL1. The side surfaces BKS1 of the first bank BNK1 may be inwardly recessed from the side surfaces BKS2 of the second bank BNK2 and from the side surfaces BKS3 of the third bank BNK3. That is, the side surfaces BKS2 of the second bank BNK2 and the side surfaces BKS3 of the is third bank BNK3 may protrude from the side surfaces BKS1 of the first bank BNK1 toward the first emission area EA1 and may thus include protruding tips. Thus, undercuts may be formed below the tips of the second bank BNK2. The first bank BNK1 may be thicker than each of the second and third banks BNK2 and BNK3.

At least one of the first, second, and third banks BNK1, BNK2, and BNK3 may include a different metal material from the other bank(s) BNK. The first bank BNK1 may have a different etching rate from the second and third banks BNK2 and BNK3. For example, in a wet etching process, the first bank BNK1 may be etched faster and by a greater amount than the second and third banks BNK2 and BNK3 during the formation of the first, second, and third emission areas EA1, EA2, and EA3. Thus, the shapes of the side surfaces BKS1 of the first bank BNK1, the side surfaces BKS2 of the second bank BNK2, and the side surfaces BKS3 of the third bank BNK3 may be determined by the differences in etching rate between the first, second, and third banks BNK1, BNK2, and BNK3. The first bank BNK1 may include a metal material with high electrical conductivity, and the second bank BNK2 may include a material with low reflectance. For example, the first bank BNK1 may include aluminum (Al), and the second and third banks BNK2 and BNK3 may include titanium (Ti). However, the present disclosure is not limited to this example.

The banks BNK may define openings therein, which form the first, second, and third emission areas EA1, EA2, and EA3, and may overlap with a light-blocking member BM of the color filter layer CFL in a plan view. The first and third banks BNK1 and BNK3 may electrically connect the first, second, and third common electrodes CE1, CE2, and CE3, which are spaced apart from one another. The second bank BNK2 may include a material with low reflectance and may thus be able to reduce the reflection of external light.

The banks BNK may form the first, second, and third emission areas EA1, EA2, and is EA3 via a mask process, and the first, second, and third light-emitting layers EL1, EL2, and EL3 may be formed in the first, second, and third emission areas EA1, EA2, and EA3, respectively. A mask process may require a structure for mounting masks and an excessively large non-display area NDA for distribution control. If mask processes can be minimized, the structure for mounting masks may not be provided, and the size of the non-display area NDA for distribution control can be minimized.

The first, second, and third light-emitting elements ED1, ED2, and ED3 may be formed by deposition and etching processes, rather than by a mask process. As at least one of the first, second, and third banks BNK1, BNK2, and BNK3 includes a different metal material from the other bank(s), the inner sidewalls of each of the banks BNK may have tips, and different layers may be formed separately in each of the first, second, and third emission areas EA1, EA2, and EA3 via a deposition process. For example, the first light-emitting layer EL1 and the first organic pattern ELP1 may be formed of the same organic material by a deposition process not using a mask and may be cut and separated from each other by the tips on the inner sidewalls of each of the banks BNK. The first light-emitting layer EL1 may be disposed in the first emission area EA1, and the first organic pattern ELP1 may be disposed on the banks BNK, between the first, second, and third emission areas EA1, EA2, and EA3.

An organic material for forming the first light-emitting layer EL1 may be deposited on the entire surface of the display device 10 and may be removed from the second and third emission areas EA2 and EA3. An organic material for forming the second light-emitting layer EL2 may be deposited on the entire surface of the display device 10 and may be removed from the first and third emission areas EA1 and EA3. An organic material for forming the third light-emitting layer EL3 may be deposited on the entire surface of the display device 10 and may be removed from the first and second emission areas EA1 and EA2. Accordingly, different is organic layers may be formed in different emission areas by deposition and etching processes, rather than by a mask process. As unnecessary processes can be omitted, the manufacturing cost of the display device 10 can be reduced, and the size of the non-display area NDA can be minimized.

The first organic pattern ELP1 may include the same organic material as the first light-emitting layer EL1 and may be disposed on the second bank BNK2. The first organic pattern ELP1 may cover side surfaces BKS2 of parts of the second bank BNK2 adjacent to the first emission area EA1. The first light-emitting layer EL1 and the first organic pattern ELP1 may be deposited by the same process and may be cut and separated from each other by the tips formed on the inner sidewalls of each of the banks BNK. Accordingly, the first organic pattern ELP1 may be disposed on the second bank BNK2, in areas other than the first, second, and third emission areas EA1, EA2, and EA3.

The first electrode pattern CEP1 may include the same metal material as the first common electrode CE1 and may be disposed on the first organic pattern ELP1. The first electrode pattern CEP1 may cover side surfaces of parts of the first organic pattern ELP1 adjacent to the first emission area EA1. The first common electrode CE1 and the first electrode pattern CEP1 may be deposited by the same process and may be cut by the tips formed on the inner sidewalls of each of the banks BNK. Accordingly, the first electrode pattern CEP1 may be disposed on the first organic pattern ELP1, in the areas other than the first, second, and third emission areas EA1, EA2, and EA3.

The first capping pattern CLP1 may include the same inorganic material as the capping layer CAP and may be disposed on the first electrode pattern CEP1. The first capping pattern CLP1 may cover side surfaces of parts of the first electrode pattern CEP1 adjacent to the first emission area EA1. The capping layer CAP and the first capping pattern CLP1 may be deposited by the same process and may be cut by the tips formed on the inner sidewalls of each of the banks BNK. Accordingly, the first capping pattern CLP1 may be disposed on the first electrode pattern CEP1, in areas other than the first, second, and third emission areas EA1, EA2, and EA3.

The first inorganic layer TL1 may be disposed on part of the capping layer CAP in the first emission area EA1 and on the first capping pattern CLP1, in the first emission area EA1. The first inorganic layer TL1 may cover side surfaces BKS1 of parts of the first bank BNK1 that surround the first emission area EA1. The first inorganic layer TL1 may include an inorganic material and may prevent oxygen or moisture from penetrating the first light-emitting element ED1. The first inorganic layer TL1 may be an inorganic encapsulation layer. For example, the first inorganic layer TL1 may include at least one of a silicon nitride layer, a silicon oxynitride layer, a silicon oxide layer, a titanium oxide layer, an aluminum oxide layer, and an amorphous silicon layer, but the present disclosure is not limited thereto.

The second organic pattern ELP2 may include the same organic material as the second light-emitting layer EL2 and may be disposed on the first inorganic layer TL1. The second organic pattern ELP2 may cover side surfaces of parts of the second bank BNK2, the first organic pattern ELP1, the first electrode pattern CEP1, the first capping pattern CLP1, and the first inorganic layer TL1 that are adjacent to the second emission area EA2. The second light-emitting layer EL2 and the second organic pattern ELP2 may be deposited by the same process and may be cut by the tips formed on the inner sidewalls of each of the banks BNK. Accordingly, the second organic pattern ELP2 may be disposed on the first inorganic layer TL1, in areas adjacent to the second or third emission area EA2 or EA3.

The second electrode pattern CEP2 may include the same material as the second common electrode CE2 and may be disposed on the second organic pattern ELP2. The second electrode pattern CEP2 may cover side surfaces of parts of the second organic pattern ELP2 adjacent to the second emission area EA2. The second common electrode CE2 and the second electrode pattern CEP2 may be deposited by the same process and may be cut by the tips formed on the inner sidewalls of each of the banks BNK. Accordingly, the second electrode pattern CEP2 may be disposed on the second organic pattern ELP2, in the areas adjacent to the second or third emission area EA2 or EA3.

The second capping pattern CLP2 may include the same inorganic material as the capping layer CAP and may be disposed on the second electrode pattern CEP2. The second capping pattern CLP2 may cover side surfaces of parts of the second electrode pattern CEP2 adjacent to the second emission area EA2. The capping layer CAP and the second capping pattern CLP2 may be deposited by the same process and may be cut by the tips formed on the inner sidewalls of each of the banks BNK. Accordingly, the second capping pattern CLP2 may be disposed on the second electrode pattern CEP2, in the areas adjacent to the second emission area EA2.

The second inorganic layer TL2 may be disposed on part of the capping layer CAP in the second emission area EA2 and on the second capping pattern CLP2. The second inorganic layer TL2 may cover side surfaces BKS1 of parts of the first bank BNK1 that surround the second emission area EA2. The second inorganic layer TL2 may include an inorganic material and may prevent oxygen or moisture from penetrating the second light-emitting element ED2. The second inorganic layer TL2 may be an inorganic encapsulation layer. For example, the second inorganic layer TL2 may be formed of one of the aforementioned exemplary materials for forming the first inorganic layer TL1.

The third organic pattern ELP3 may include the same organic material as the third light-emitting layer EL3 and may be disposed on the second inorganic layer TL2. The third organic pattern ELP3 may cover side surfaces of parts of the second bank BNK2, the first organic pattern ELP1, the first electrode pattern CEP1, the first capping pattern CLP1, the first inorganic layer TL1, the second organic pattern ELP2, the second electrode pattern CEP2, the second capping pattern CLP2, and the second inorganic layer TL2 that are adjacent to the third emission area EA3. The third light-emitting layer EL3 and the third organic pattern ELP3 may be deposited by the same process and may be cut by the tips formed on the inner sidewalls of each of the banks BNK. Accordingly, the third organic pattern ELP3 may be disposed on the second inorganic layer TL2, in areas adjacent to the third emission area EA3.

The third electrode pattern CEP3 may include the same metal material as the third common electrode CE3 and may be disposed on the third organic pattern ELP3. The third electrode pattern CEP3 may cover side surfaces of parts of the third organic pattern ELP3 adjacent to the third emission area EA3. The third common electrode CE3 and the third electrode pattern CEP3 may be deposited by the same process and may be cut by the tips formed on the inner sidewalls of each of the banks BNK. Accordingly, the third electrode pattern CEP3 may be disposed on the third organic pattern ELP3, in the areas adjacent to the third emission area EA3.

The third capping pattern CLP3 may include the same inorganic material as the capping layer CAP and may be disposed on the third electrode pattern CEP3. The third capping pattern CLP3 may cover side surfaces of parts of the third electrode pattern CEP3 adjacent to the third emission area EA3. The capping layer CAP and the third capping pattern CLP3 may be deposited by the same process and may be cut by the tips formed on the inner sidewalls of each of the banks BNK. Accordingly, the third capping pattern CLP3 may be disposed on the third electrode pattern CEP3, in the areas adjacent to the third emission area EA3.

The third inorganic layer TL3 may be disposed on part of the capping layer CAP in the third emission area EA3 and on the third capping pattern CLP3. The third inorganic layer TL3 may cover side surfaces BKS1 of parts of the first bank BNK1 that surround the third emission area EA3. The third inorganic layer TL3 may include an inorganic material and may prevent oxygen or moisture from penetrating the second light-emitting element ED2. The third inorganic layer TL3 may be an inorganic encapsulation layer. For example, the third inorganic layer TL3 may be formed of one of the aforementioned exemplary materials for forming the first inorganic layer TL1.

The encapsulation layer TFEL may be disposed on the first, second, and third inorganic layers TL1, TL2, and TL3 to cover the light-emitting element layer EML. The encapsulation layer TFEL may include first and second encapsulation layers TFE1 and TFE2.

The first encapsulation layer TFE1 may be disposed on the first, second, and third inorganic layers TL1, TL2, and TL3 to planarize the top of the light-emitting element layer EML. The first encapsulation layer TFE1 may include an organic material and may protect the light-emitting element layer EML from a foreign material such as dust. For example, the first encapsulation layer TFE1 may include an organic film formed of an acrylic resin, an epoxy resin, a phenolic resin, a polyamide resin, or a PI resin. The first encapsulation layer TFE1 may be formed by curing a monomer or applying a polymer.

The second encapsulation layer TFE2 may be disposed on the first encapsulation layer TFE1. The second encapsulation layer TFE2 may include an inorganic material and may prevent oxygen or moisture from penetrating the light-emitting element layer EML. For example, the second encapsulation layer TFE2 may include at least one of a silicon nitride layer, a silicon oxynitride layer, a silicon oxide layer, a titanium oxide layer, an aluminum oxide layer, and an amorphous silicon layer, but the present disclosure is not limited thereto.

The touch sensing unit TSU may be disposed on the encapsulation layer TFEL. The touch sensing unit TSU may include a third buffer layer BF3, bridge electrodes BRG, a second insulating layer IL2, touch electrodes TE, and a third insulating layer IL3.

The third buffer layer BF3 may be disposed on the encapsulation layer TFEL. The third buffer layer BF3 may have an insulation function and an optical function. The third buffer layer BF3 may include at least one inorganic film. The third buffer layer BF3 may be optional.

The bridge electrodes BRG may be disposed on the third buffer layer BF3. The bridge electrodes BRG may be disposed in a different layer from the touch electrodes TE and may electrically connect the touch electrodes TE to one another.

The second insulating layer IL2 may be disposed on the bridge electrodes BRG and the third buffer layer BF3. The second insulating layer IL2 may have an insulation function and an optical function. For example, the second insulating layer IL2 may include at least one of a silicon nitride layer, a silicon oxynitride layer, a silicon oxide layer, a titanium oxide layer, an aluminum oxide layer, and an amorphous silicon layer, but the present disclosure is not limited thereto.

The touch electrodes TE may be disposed on the second insulating layer IL2. The touch electrodes TE may include driving electrodes and sensing electrodes and may sense variations in the mutual capacitance between the driving electrodes and the sensing electrodes. The touch electrodes TE may not overlap with the first, second, and third emission areas EA1, EA2, and EA3 in a plan view. The touch electrodes TE may be formed as single layers including Mo, Ti, Cu, Al, or ITO or as stacks of Al and Ti (e.g., (Ti/Al/Ti), stacks of Al and ITO (e.g., ITO/Al/ITO), layers of a silver (Ag)-palladium (Pd)-copper (Cu) ("APC") alloy, or stacks of an APC alloy and ITO (e.g., ITO/APC/ITO).

The third insulating layer IL3 may be disposed on the touch electrodes TE and the second insulating layer IL2. The third insulating layer IL3 may have an insulation function and an optical function. The third insulating layer IL3 may be formed of one of the aforementioned exemplary materials for forming the second insulating layer IL2.

The color filer layer CFL may be disposed on the touch sensing unit TSU. The color filter layer CFL may include the light-blocking member BM, a plurality of color filters CF, and a planarization layer OC.

The light-blocking member BM may be disposed on the third insulating layer IL3 and may surround first, second, and third optical areas OPT1, OPT2, and OPT3. The light-blocking member BM may overlap with the touch electrodes TE in a plan view. The light-blocking member BM may include a light-absorbing material and may prevent the reflection of light. For example, the light-blocking member BM may include an inorganic black pigment, an organic black pigment, or an organic blue pigment. The inorganic black pigment may be a metal oxide such as carbon black or titanium (Ti) black, the organic black pigment may be at least one of lactam black, perylene black, and aniline black, and the organic blue pigment may be C.I. pigment blue. However, the present disclosure is not limited to this. The light-blocking member BM can improve the color reproducibility of the display device 10 by preventing visible light from penetrating between the first, second, and third emission areas EA1, EA2, and EA3 to cause color mixing.

The color filters CF may include first, second, and third color filters CF1, CF2, and CF3. The first, second, and third color filters CF1, CF2, and CF3 may be disposed on the third insulating layer IL3 to correspond to the first, second, and third emission areas EA1, EA2, and EA3, respectively.

The first color filter CF1 may be disposed on the third insulating layer IL3, in the first emission area EA1. The first color filter CF1 may be surrounded by the first emission area EA1, in a plan view. The edges of the first color filter CF1 may cover part of the top surface of the light-blocking member BM, but the present disclosure is not limited thereto. The first color filter CF1 may selectively transmit first-color light (e.g., red light) therethrough and may block or absorb second-color light (e.g., green light) and third-color light (e.g., blue light). For example, the first color filter CF1 may be a red color filter and may include a red colorant.

The second color filter CF2 may be disposed on the third insulating layer IL3, in the second emission area EA2. The second color filter CF2 may be surrounded by the second emission area EA2, in a plan view. The edges of the second color filter CF2 may cover part of the top surface of the light-blocking member BM, but the present disclosure is not limited thereto. The second color filter CF2 may selectively transmit second-color light (e.g., green light) therethrough and may block or absorb first-color light (e.g., red light) and third-color light (e.g., blue light). For example, the second color filter CF2 may be a green color filter and may include a green colorant.

The third color filter CF3 may be disposed on the third insulating layer TL3, in the third emission area EA3. The third color filter CF3 may be surrounded by the third emission area EA3, in a plan view. The edges of the third color filter CF3 may cover part of the top surface of the light-blocking member BM, but the present disclosure is not limited thereto. The third color filter CF3 may selectively transmit third-color light (e.g., blue light) therethrough and may block or absorb first-color light (e.g., red light) and second-color light (e.g., green light). For example, the third color filter CF3 may be a blue color filter and may include a blue colorant.

The first, second, and third color filters CF1, CF2, and CF3 may reduce reflected light of external light by absorbing some of the external light. Accordingly, the first, second, and third color filters CF1, CF2, and CF3 can prevent color distortion that may be caused by the reflection of the external light.

The planarization layer OC may be disposed on the light-blocking member BM and the first, second, and third color filters CF1, CF2, and CF3. The planarization layer OC may planarize the top of the color filter layer CFL. For example, the planarization layer OC may include an organic insulating material.

FIGS. 6 through 15 are cross-sectional views illustrating an example of how to fabricate the display device of FIG. 4.

Figure 6:
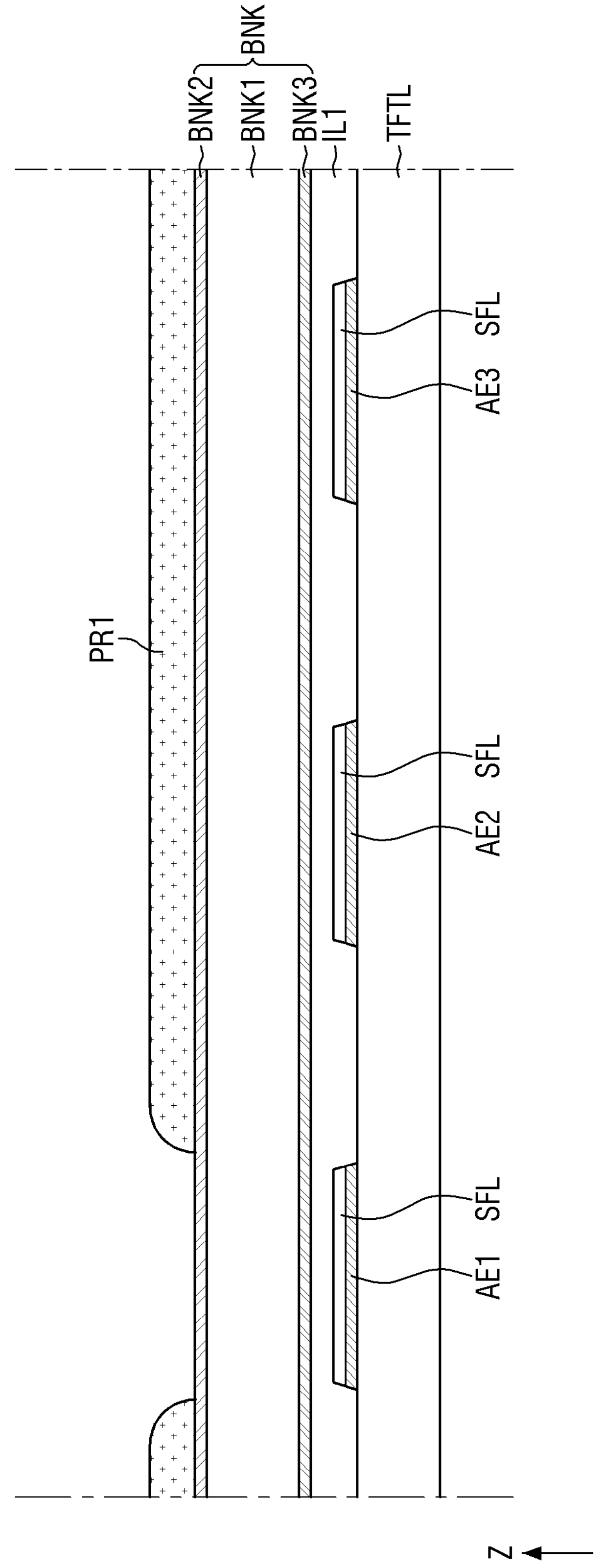
FIGS. 6 through 15 are cross-sectional views illustrating an example of how to fabricate the display device of FIG. 4.

Referring to FIG. 6, the first, second, and third pixel electrodes AE1, AE2, and AE3 may be disposed to be spaced apart from one another on the TFT layer TFTL. For example, the first, second, and third pixel electrodes AE1, AE2, and AE3 may include at least one of Ag, Cu, Al, Ni, and La. In another example, the first, second, and third pixel electrodes AE1, AE2, and AE3 may include ITO, IZO, or ITZO. In another example, the first, second, and third pixel electrodes AE1, AE2, and AE3 may have a stack structure such as ITO/Ag/ITO/, ITO/Ag/IZO, or ITO/Ag/ITZO/IZO.

The sacrificial layer SFL may be disposed on the first, second, and third pixel electrodes AE1, AE2, and AE3. The sacrificial layer SFL may be disposed between the top surfaces of the first, second, and third pixel electrodes AE1, AE2, and AE3 and the first insulating layer IL1. The sacrificial layer SFL may include an oxide semiconductor. For example, the sacrificial layer SFL may include at least one of indium gallium zinc oxide (IZO), zinc tin oxide (ZTO), and IZO.

The first insulating layer IL1 may be disposed on the TFT layer TFTL and the sacrificial layer SFL. The first insulating layer IL1 may include an inorganic insulating material. The first insulating layer IL1 may include at least one of a silicon nitride layer, a silicon oxynitride layer, a silicon oxide layer, a titanium oxide layer, an aluminum oxide layer, and an amorphous silicon layer, but the present disclosure is not limited thereto.

The third bank BNK3 may be disposed on the first insulating layer IL1, the first bank BNK1 may be disposed on the third bank BNK3, and the second bank BNK2 may be disposed on the first bank BNK1. The first bank BNK1 may be thicker than the second or third bank BNK2 and BNK3.

A first photoresist PR1 may be disposed on the second bank BNK2 not to overlap with the first pixel electrode AE1 in a plan view. The first photoresist PR1 may be provided in regions other than a region in which the first emission area EA1 is to be formed.

Figure 7:
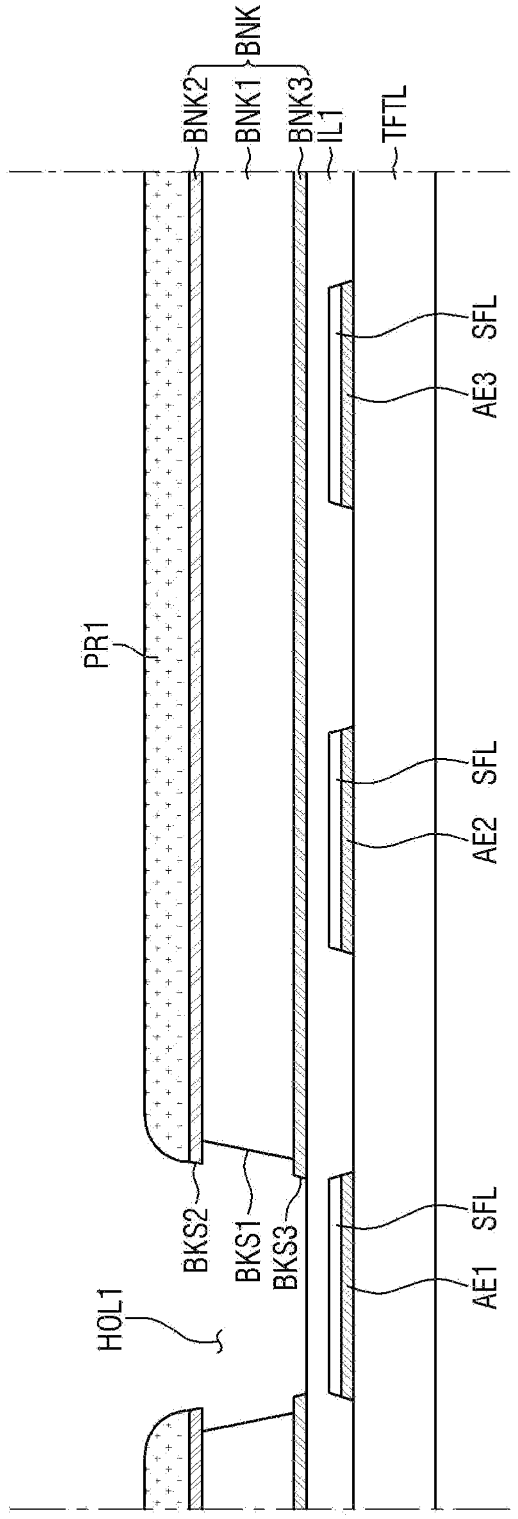

Referring to FIG. 7, the second bank BNK2, the first bank BNK1, and the third bank BNK3 may be sequentially etched, thereby forming a first hole HOL1. The first hole HOL1 may overlap with the first emission area EA1. The first, second, and third banks BNK1, BNK2, and BNK3 may be etched by at least one of dry etching and wet etching. For example, the first, second, and third banks BNK1, BNK2, and BNK3 may be etched primarily by dry etching and secondarily by wet etching, but the present disclosure is not limited thereto. At least one of the first, second, and third banks BNK1, BNK2, and BNK3 may include a different metal material from the other bank(s) BNK and may have a different etching rate from the other bank(s) BNK. In a wet etching process, the first bank BNK1 may be etched faster and by a greater amount than the second and third banks BNK2 and BNK3. Thus, the shapes of the side surfaces BKS1 of the first bank BNK1, the side surfaces BKS2 of the second bank BNK2, and the side surfaces BKS3 of the third bank BNK3 may be determined by the differences in etching rate between the first, second, and third banks BNK1, BNK2, and BNK3. The second bank BNK2 may include tips protruding from the first bank BNK1 toward the first hole HOL1. The side surfaces BKS1 of the first bank BNK1 may be inwardly recessed from the side surfaces BKS2 of the second bank BNK2 and the side surfaces BKS3 of the third bank BNK3. Undercuts may be formed below the tips of the second bank BNK2. The first bank BNK1 may be thicker than each of the second and third banks BNK2 and BNK3.

The first bank BNK1 may include a metal material with high electrical conductivity, and the second bank BNK2 may include a material with low reflectance. For example, the first bank BNK1 may include aluminum (Al), and the second and third banks BNK2 and BNK3 may include titanium (Ti). However, the present disclosure is not limited to this example.

Figure 8:
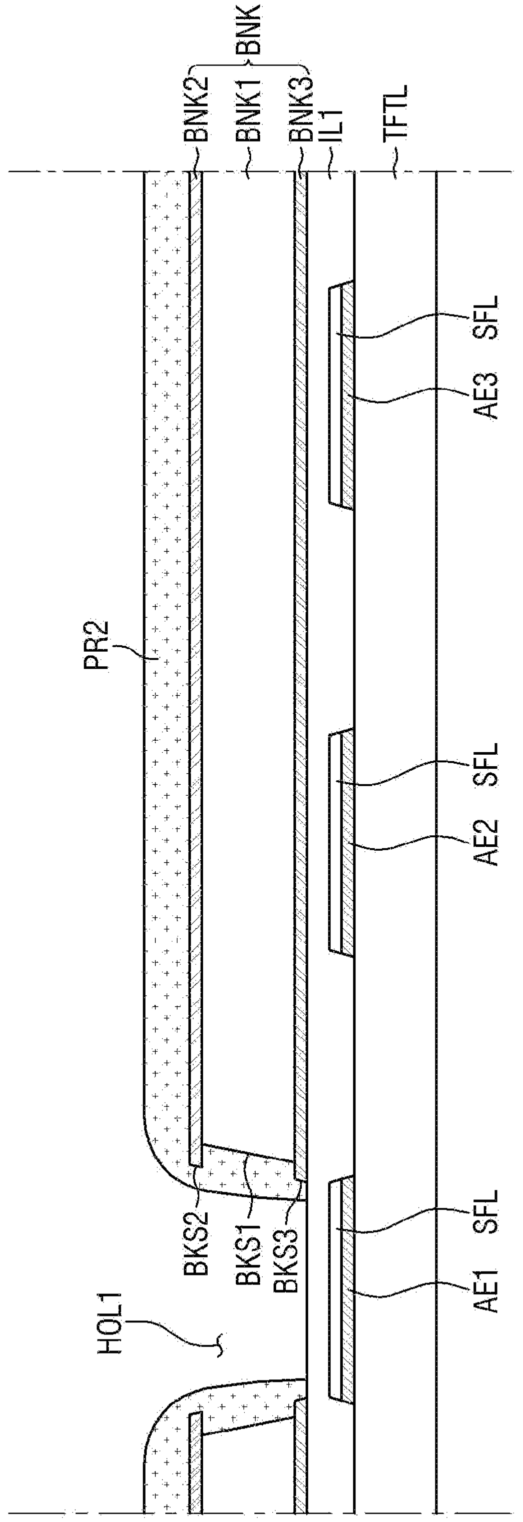

Referring to FIG. 8, the first insulating layer TL1 may be etched using a second photoresist PR2, which is different from the first photoresist PR1. The second photoresist PR2 may further cover the side surfaces of each of the banks BNK, compared to the first photoresist PR1. The second photoresist PR2 may cover the side surfaces BKS1 of the first bank BNK1, the side surfaces BKS2 of the second bank BNK2, and the side surfaces BKS3 of the third bank BNK3. The second photoresist PR2 may cover both the side surfaces and the top surface of each of the banks BNK and may protect the side surfaces of each of the banks BNK. The second photoresist PR2 may have a larger planar area than the first photoresist PR1. For example, in a case where the first bank BNK1 includes aluminum (Al) and the first insulating layer IL1 is formed by dry etching, the second photoresist PR2 may prevent the first bank BNK1 from being plasma-oxidated. As the first insulating layer IL1 and the banks BNK are etched by separate etching processes, damage to the residual patterns RP can be controlled, and the display device 10 can include relatively thin residual patterns RP.

Figure 9:
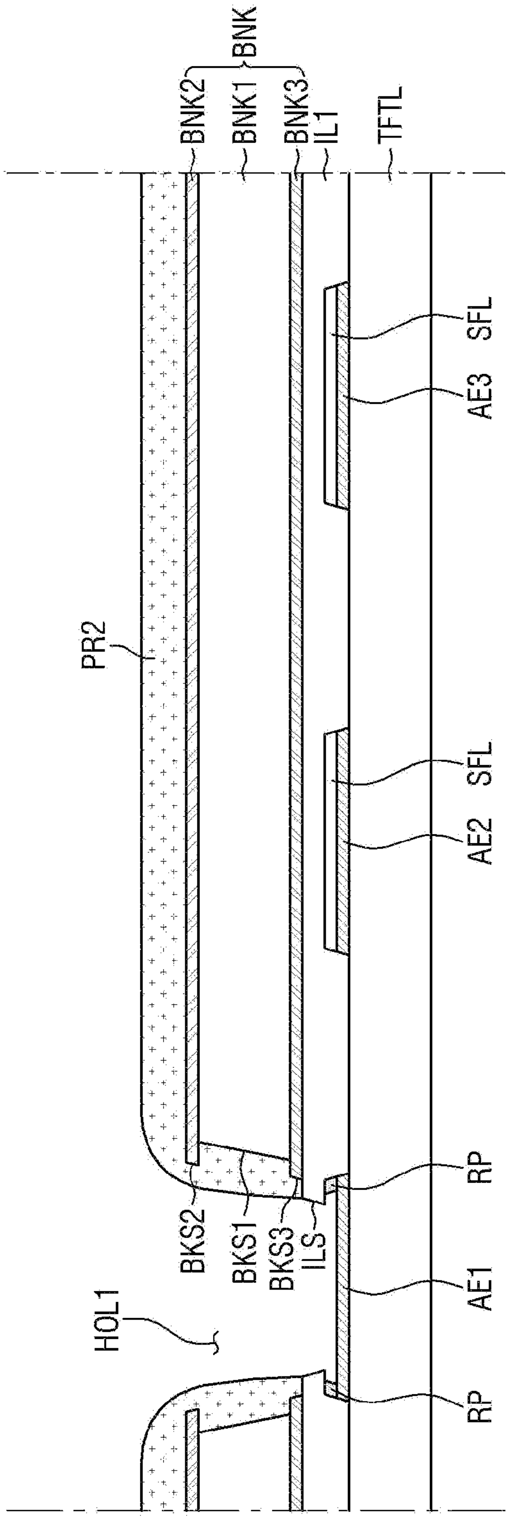

Referring to FIG. 9, the first insulating layer IL1 and the sacrificial layer SFL may be etched by at least one of dry etching and wet etching. For example, the first insulating layer IL1 may be etched by dry etching, and the sacrificial layer SFL may be etched by wet etching. However, the present disclosure is not limited to this example. As the first insulating layer IL1 and the sacrificial layer SFL are etched, at least part of the top surface of the first pixel electrode AE1 may be exposed. In a wet etching process, the sacrificial layer SFL may be etched by a greater amount than the first insulating layer IL. As the sacrificial layer SFL is etched, the residual patterns RP may remain between the first insulating layer IL1 and the first pixel electrode AE1. Accordingly, the side surfaces of each of the residual patterns RP may be inwardly recessed from the side surfaces ILS of the first insulating layer IL1.

The first insulating layer IL1 may have inclined side surfaces ILS. The first insulating layer IL1 may be etched from above, and the side surfaces ILS of the first insulating layer IL1 may face the top of the light-emitting element layer EML. The inclination angle of the side surfaces ILS of the first insulating layer IL1 may be determined by the inclination angle of the second photoresist PR2. For example, if the slope of side surfaces of the second photoresist PR2 is steep (e.g., almost perpendicular), the side surfaces ILS of the first insulating layer IL1 may have a steep slope. On the contrary, if the slope of the side surfaces of the second photoresist PR2 is gentle (e.g., almost flat), the side surfaces ILS of the first insulating layer IL1 may have a gentle slope. The side surfaces ILS of the first insulating layer IL1 may be spaced apart from the side surfaces of each of the banks BNK. The side surfaces ILS of the first insulating layer IL1 may be spaced apart from the side surfaces BKS1 of the first bank BNK1, the side surfaces BKS2 of the second bank BNK2, and the side surfaces BKS3 of the third bank BNK3.

Figure 10:
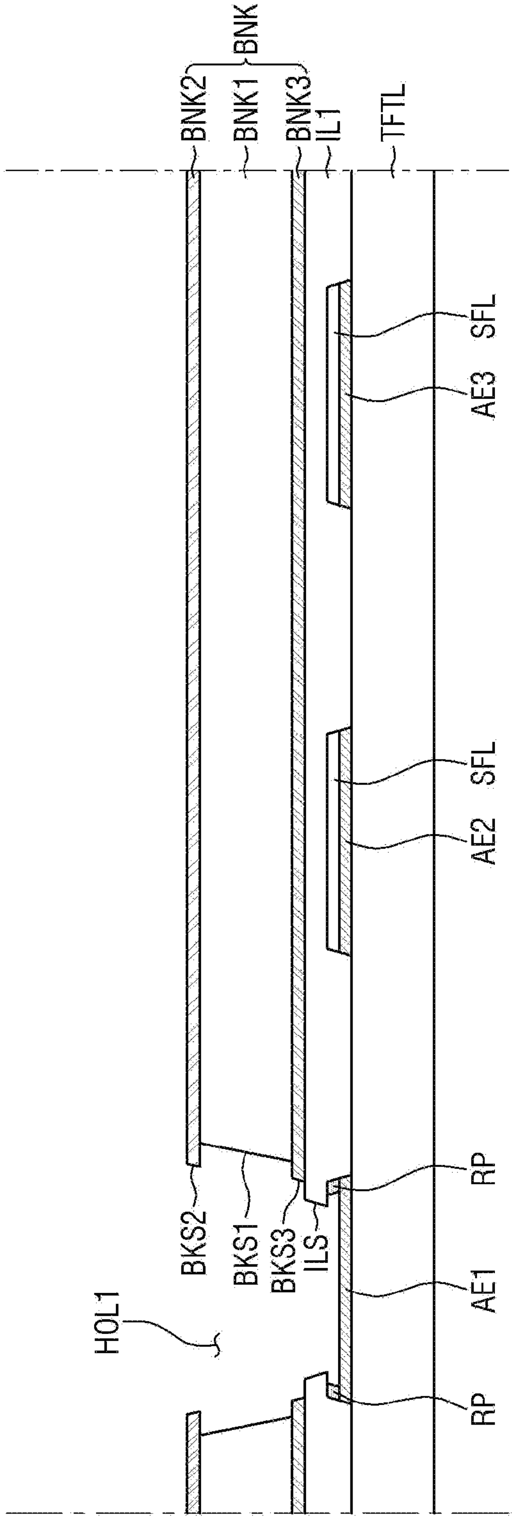

Referring to FIG. 10, the second photoresist PR may be removed by a strip process after the etching of the first insulating layer IL1 and the sacrificial layer SFL.

Figure 11:
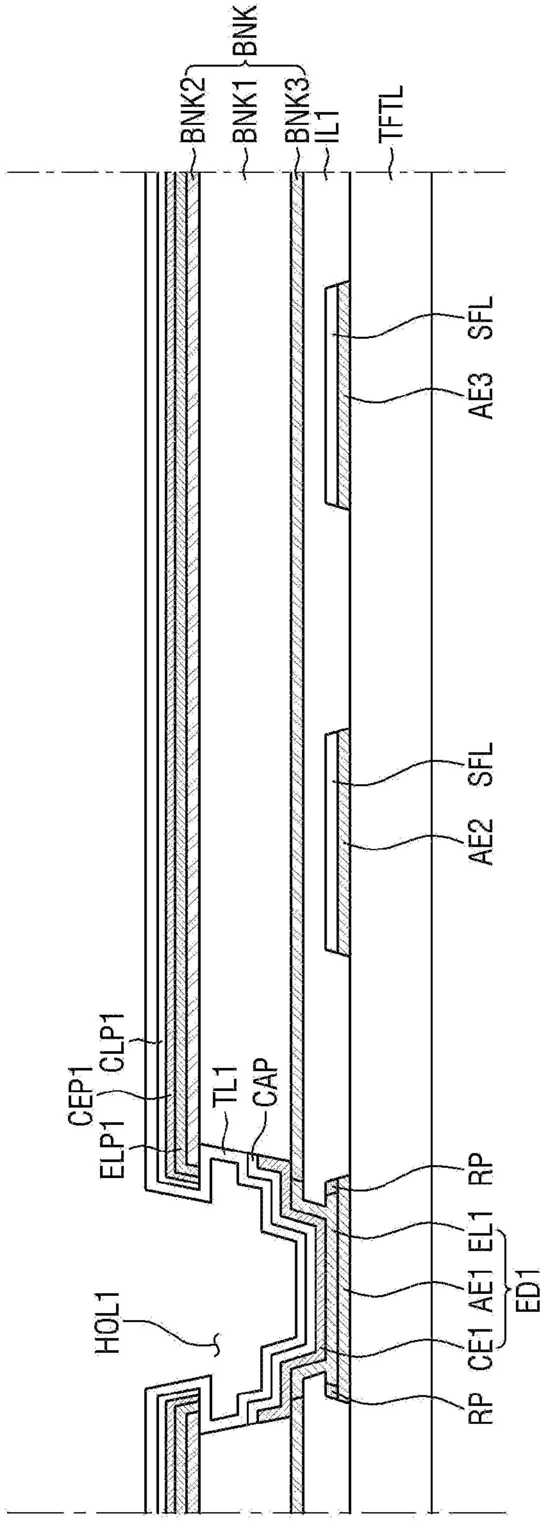

Referring to FIG. 11, the first light-emitting layer EL1 may be disposed directly on the first pixel electrode AE1, in the first emission area EA1. Part of the first light-emitting layer EL1 may fill the space surrounded by the first pixel electrode AE1, the residual patterns RP, and the first insulating layer IL1, and another part of the first light-emitting layer EL1 may cover part of the top surface of the first insulating layer IL1 and some of the side surfaces ILS of the first insulating layer IL1.

The organic material for forming the first light-emitting layer EL1 and the first organic pattern ELP1 may be deposited on the entire surface of the display device 10. The first organic pattern ELP1 may include the same organic material as the first light-emitting layer EL1 and may be disposed on the second bank BNK2. The first organic pattern ELP1 may cover the side surfaces BKS2 of the parts of the second bank BNK2 adjacent to the first emission area EA1. The first light-emitting layer EL1 and the first organic pattern ELP1 may be deposited by the same process and may be cut and separated from each other by the tips formed on the inner sidewalls of each of the banks BNK. Accordingly, the first organic pattern ELP1 may be disposed on the second bank BNK2, in areas other than the first emission area EA1.

The first common electrode CE1 may be disposed on the first light-emitting layer EL1. The first common electrode CE1 may include a transparent conductive material and may transmit light generated by the first light-emitting layer EL1 therethrough. The first common electrode CE1 may be in contact with the side surfaces BKS1 of the first bank BNK1 and the top surface of the third bank BNK3. Thus, the first light-emitting element ED1 may be formed in the first hole HOL1 and may emit light through the first emission area EA1.

The metal material for forming the first common electrode CE1 and the first electrode pattern CEP1 may be deposited on the entire surface of the display device 10. The first electrode pattern CEP1 may include the same metal material as the first common electrode CE1 and may be disposed on the first organic pattern ELP1. The first electrode pattern CEP1 may cover the side surfaces of the parts of the first organic pattern ELP1 adjacent to the first emission area EA1. The first common electrode CE1 and the first electrode pattern CEP1 may be deposited by the same process and may be cut by the tips formed on the inner sidewalls of each of the banks BNK. Accordingly, the first electrode pattern CEP1 may be disposed on the first organic pattern ELP1, in the areas other than the first emission area EA1.

The capping layer CAP may be disposed on the first common electrode CE1. The capping layer CAP may include an inorganic insulating material and may cover the first light-emitting element ED1. The capping layer CAP may prevent the first common electrode CE1 from being damaged by external air. For example, the capping layer CAP may include at least one of a silicon nitride layer, a silicon oxynitride layer, a silicon oxide layer, a titanium oxide layer, an aluminum oxide layer, and an amorphous silicon layer, but the present disclosure is not limited thereto.

The inorganic material for forming the capping layer CAP and the first capping pattern CLP1 may be deposited on the entire surface of the display device 10. The first capping pattern CLP1 may include the same inorganic material as the capping layer CAP and may be disposed on the first electrode pattern CEP1. The first capping pattern CLP1 may cover the side surfaces of the parts of the first electrode pattern CEP1 adjacent to the first emission area EA1. The capping layer CAP and the first capping pattern CLP1 may be deposited by the same process and may be cut by the tips formed on the inner sidewalls of each of the banks BNK. Accordingly, the first capping pattern CLP1 may be disposed on the first electrode pattern CEP1, in the areas other than the first emission area EA1.

The first inorganic layer TL1 may be disposed on the part of the capping layer CAP in the first emission area EA1 and on the first capping pattern CLP1. The first inorganic layer TL1 may cover the side surfaces BKS1 of the parts of the first bank BNK1 that surround the first emission area EA1. The first inorganic layer TL1 may include an inorganic material and may prevent oxygen or moisture from penetrating the first light-emitting element ED1. The first inorganic layer TL1 may be an inorganic encapsulation layer. For example, the first inorganic layer TL1 may include at least one of a silicon nitride layer, a silicon oxynitride layer, a silicon is oxide layer, a titanium oxide layer, an aluminum oxide layer, and an amorphous silicon layer, but the present disclosure is not limited thereto.

Figure 12:
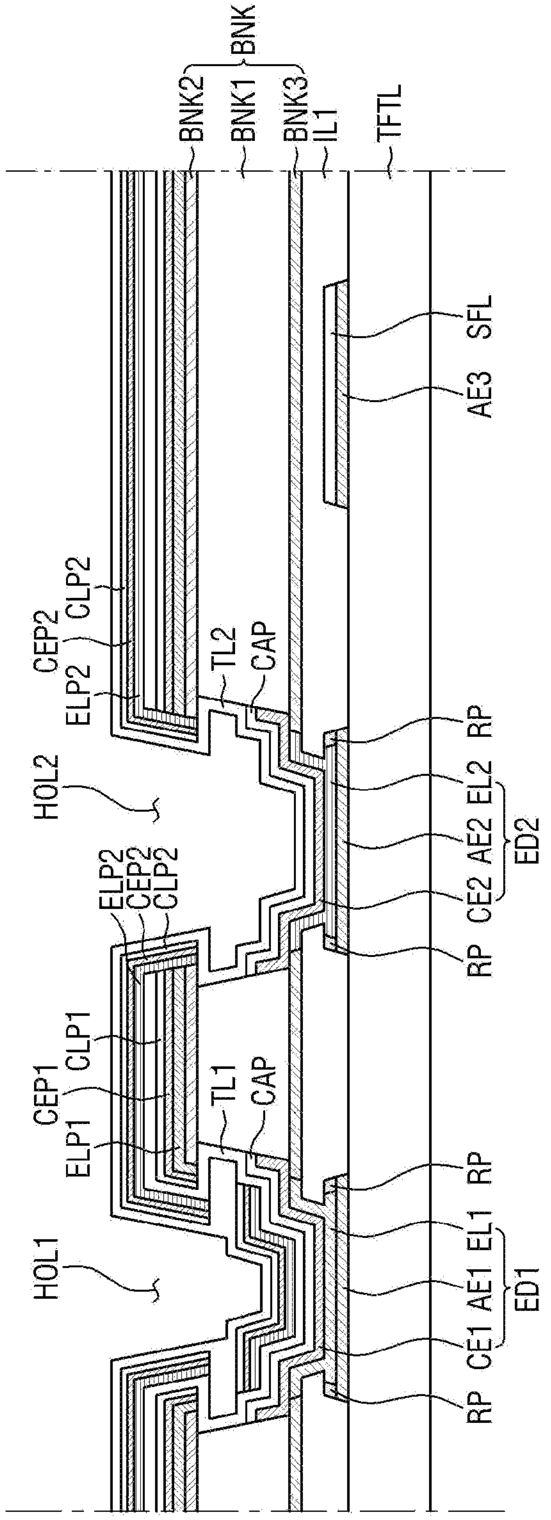

Referring to FIG. 12, a second hole HOL2 may overlap with the second emission area EA2. The second hole HOL2 may be formed by sequentially etching the first inorganic layer TL1, the first capping pattern CLP1, the first electrode pattern CEP1, the first organic pattern ELP1, the second bank BNK2, the first bank BNK1, the third bank BNK3, the first insulating layer IL1, and the sacrificial layer SFL. During the formation of the second hole HOL2, the first, second, and third banks BNK1, BNK2, and BNK3, the first insulating layer ILi, and the sacrificial layer SFL may be etched in substantially the same manner as that described above with reference to FIGS. 7 through 9.

The second light-emitting layer EL2 may be disposed directly on the second pixel electrode AE2, in the second emission area EA2. Part of the second light-emitting layer EL2 may fill the space filled by the second pixel electrode AE2, the residual patterns RP, and the first insulating layer IL1, and another part of the second light-emitting layer EL2 may cover part of the top surface of the first insulating layer IL1 and some of the side surfaces ILS of the first insulating layer IL1.

The organic material for forming the second light-emitting layer EL2 and the second organic pattern ELP2 may be deposited on the entire surface of the display device 10. The second organic pattern ELP2 may include the same organic material as the second light-emitting layer EL2 and may be disposed on the first inorganic layer TL1. The second organic pattern ELP2 may cover the side surfaces of the parts of the second bank BNK2, the first organic pattern ELP1, the first electrode pattern CEP1, the first capping pattern CLP1, and the first inorganic layer TL1 that are adjacent to the second emission area EA2. The second light-emitting layer EL2 and the second organic pattern ELP2 may be deposited by the same process and may be cut by the tips formed on the inner sidewalls of each of the banks BNK. Accordingly, the second organic pattern ELP2 may be disposed on the first inorganic layer TL1, in areas other than the second emission area EA2.

The second common electrode CE2 may be disposed on the second light-emitting layer EL2. The second common electrode CE2 may include a transparent conductive material and may transmit light generated by the second light-emitting layer EL2 therethrough. The second common electrode CE2 may be in contact with the side surfaces BKS1 of the first bank BNK1 and the top surface of the third bank BNK3. Thus, the second light-emitting layer EL2 may be formed in the second hole HOL2 and may emit light through the second emission area EA2.

The metal material for forming the second common electrode CE2 and the second electrode pattern CEP2 may be deposited on the entire surface of the display device 10. The second electrode pattern CEP2 may include the same metal material as the second common electrode CE2 and may be disposed on the second organic pattern ELP2. The second electrode pattern CEP2 may cover the side surfaces of the parts of the second organic pattern ELP2 adjacent to the first emission area EA1. The second common electrode CE2 and the second electrode pattern CEP2 may be deposited by the same process and may be cut by the tips formed on the inner sidewalls of each of the banks BNK. Accordingly, the second electrode pattern CEP2 may be disposed on the second organic pattern ELP2, in the areas other than the second emission area EA2.

The capping layer CAP may be disposed on the second common electrode CE2. The capping layer CAP may include an inorganic insulating material and may cover the second light-emitting element ED2. The capping layer CAP may prevent the second light-emitting element ED2 from being damaged by external air.

The inorganic material for forming the capping layer CAP and the second capping pattern CLP2 may be deposited on the entire surface of the display device 10. The second capping pattern CLP2 may include the same inorganic material as the capping layer CAP and may be disposed on the second electrode pattern CEP2. The second capping pattern CLP2 may cover the side surfaces of the parts of the second electrode pattern CEP2 adjacent to the second emission area EA2. The capping layer CAP and the second capping pattern CLP2 may be deposited by the same process and may be cut by the tips formed on the inner sidewalls of each of the banks BNK. Accordingly, the second capping pattern CLP2 may be disposed on the second electrode pattern CEP2, in the areas other than the second emission area EA2.

The second inorganic layer TL2 may be disposed on the part of the capping layer CAP in the second emission area EA2 and on the second capping pattern CLP2. The second inorganic layer TL2 may cover the side surfaces BKS1 of the parts of the first bank BNK1 that surround the second emission area EA2. The second inorganic layer TL2 may include an inorganic material and may prevent oxygen or moisture from penetrating the second light-emitting element ED2. The second inorganic layer TL2 may be an inorganic encapsulation layer. For example, the second inorganic layer TL2 may be formed of one of the aforementioned exemplary materials for forming the first inorganic layer TL1.

Figure 13:
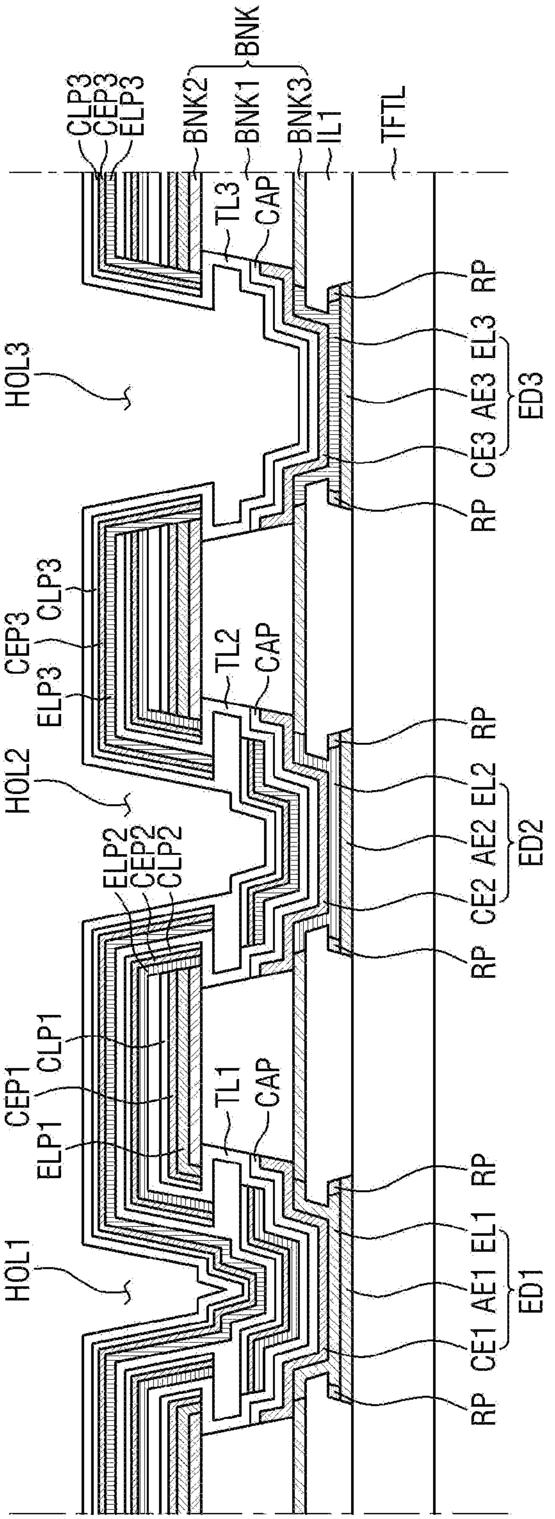

Referring to FIG. 13, a third hole HOL3 may overlap with the third emission area EA3. The third hole HOL3 may be formed by sequentially etching the second inorganic layer TL2, the second capping pattern CLP2, the second electrode pattern CEP2, the second organic pattern ELP2, the first inorganic layer T11, the first capping pattern CLP1, the first electrode pattern CEP1, the first organic pattern ELP1, the second bank BNK2, the first bank BNK1, the third bank BNK3, the first insulating layer IL1, and the sacrificial layer SFL. During the formation of the third hole HOL3, the first, second, and third banks BNK1, BNK2, and BNK3, the first insulating layer IL1, and the sacrificial layer SFL may be etched in substantially the same manner as that described above with reference to FIGS. 7 through 9.

The third light-emitting layer EL3 may be disposed directly on the third pixel electrode AE3, in the third emission area EA3. Part of the third light-emitting layer EL3 may fill the space surrounded by the third pixel electrode AE3, the residual patterns RP, and the first insulating layer IL1, and another part of the third light-emitting layer EL3 may cover part of the top surface of the first insulating layer IL1 and some of the side surfaces ILS of the first insulating layer ILS.

The organic material for forming the third light-emitting layer EL3 and the third organic pattern ELP3 may be deposited on the entire surface of the display device 10. The third organic pattern ELP3 may include the same organic material as the third light-emitting layer EL3 and may be disposed on the second inorganic layer TL2. The third organic pattern ELP3 may cover the side surfaces of the parts of the second bank BNK2, the first organic pattern ELP1, the first electrode pattern CEP1, the first capping pattern CLP1, the first inorganic layer TL1, the second organic pattern ELP2, the second electrode pattern CEP2, the second capping pattern CLP2, and the second inorganic layer TL2 that are adjacent to the third emission area EA3. The third light-emitting layer EL3 and the third organic pattern ELP3 may be deposited by the same process and may be cut by the tips formed on the inner sidewalls of each of the banks BNK. Accordingly, the third organic pattern ELP3 may be disposed on the second inorganic layer TL2, in the areas other than the third emission area EA3.

The third common electrode CE3 may be disposed on the third light-emitting layer EL3. The third common electrode CE3 may include a transparent conductive material and may transmit light generated by the third light-emitting layer EL3 therethrough. The third common electrode CE3 may be in contact with the side surfaces BKS1 of the first bank BNK1 and the top surface of the third bank BNK3. Thus, the third light-emitting layer EL3 may be formed in the third hole HOL3 and may emit light through the third emission area EA3.

The metal material for forming the third common electrode CE3 and the third electrode pattern CEP3 may be deposited on the entire surface of the display device 10. The third electrode pattern CEP3 may include the same metal material as the third common electrode CE3 and may be disposed on the third organic pattern ELP3. The third electrode pattern CEP3 may cover the side surfaces of the parts of the third organic pattern ELP3 adjacent to the third emission area EA3. The third common electrode CE3 and the third electrode pattern CEP3 may be deposited by the same process and may be cut by the tips formed on the inner sidewalls of each of the banks BNK. Accordingly, the third electrode pattern CEP3 may be disposed on the third organic pattern ELP3, in the areas other than the third emission area EA3.

The capping layer CAP may be disposed on the third common electrode CE3. The capping layer CAP may include an inorganic insulating material and may cover the third light-emitting element ED3. The capping layer CAP may prevent the third light-emitting element ED3 from being damaged by external air.

The inorganic material for forming the capping layer CAP and the third capping pattern CLP3 may be deposited on the entire surface of the display device 10. The third capping pattern CLP3 may include the same inorganic material as the capping layer CAP and may be disposed on the third electrode pattern CEP3. The third capping pattern CLP3 may cover the side surfaces of the parts of the third electrode pattern CEP3 adjacent to the third emission area EA3. The capping layer CAP and the third capping pattern CLP3 may be deposited by the same process and may be cut by the tips formed on the inner sidewalls of each of the banks BNK. Accordingly, the third capping pattern CLP3 may be disposed on the third electrode pattern CEP3, in the areas other than the third emission area EA3.

The third inorganic layer TL3 may be disposed on the part of the capping layer CAP in the third emission area EA3 and on the third capping pattern CLP3. The third inorganic layer TL3 may cover the side surfaces BKS1 of the parts of the first bank BNK1 that surround the third emission area EA3. The third inorganic layer TL3 may include an inorganic material and may prevent oxygen or moisture from penetrating the third light-emitting element ED3. The third inorganic layer TL3 may be an inorganic encapsulation layer. For example, the third inorganic layer TL3 may be formed of one of the aforementioned exemplary materials for forming the first inorganic layer TL1.

Figure 14:
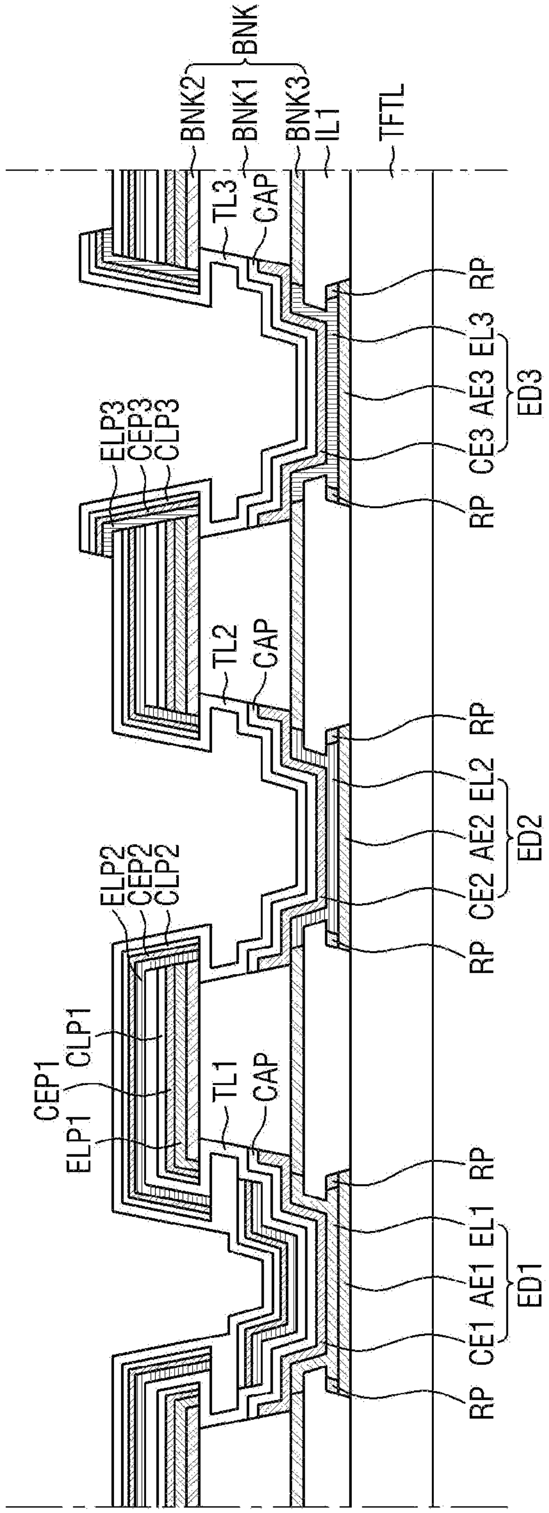

Referring to FIG. 14, the third inorganic layer TL3, the third capping pattern CLP3, the third electrode pattern CEP3, and the third organic pattern ELP3 may be sequentially etched in the first emission area EA1, the areas adjacent to the first emission area EA1, the second emission area EA2, and the areas adjacent to the second emission area EA2. The third inorganic layer TL3, the third capping pattern CLP3, the third electrode pattern CEP3, and the third organic pattern ELP3 may remain in the areas adjacent to the third emission area EA3. The third inorganic layer TL3, the third capping pattern CLP3, the third electrode pattern CEP3, and the third organic pattern ELP3 may be etched by at least one of dry etching and wet etching.

Figure 15:
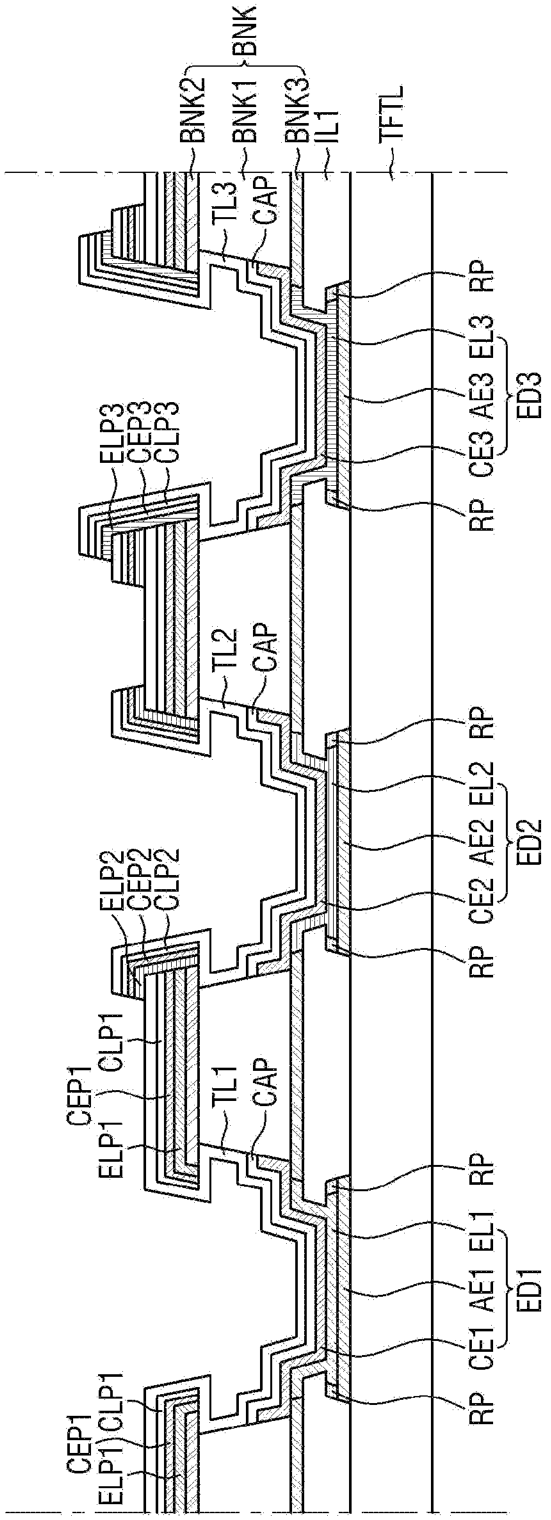

Referring to FIG. 15, the second inorganic layer TL2, the second capping pattern CLP2, the second electrode pattern CEP2, and the second organic pattern ELP2 may be sequentially etched in the first emission area EA1 and the areas adjacent to the first emission area EA1. The second inorganic layer TL2, the second capping pattern CLP2, the second electrode pattern CEP2, and the second organic pattern ELP2 may remain in the areas adjacent to the second emission area EA2. The second inorganic layer TL2, the second capping pattern CLP2, the second electrode pattern CEP2, and the second organic pattern ELP2 may be etched by at least one of dry etching and wet etching.

Figure 16:
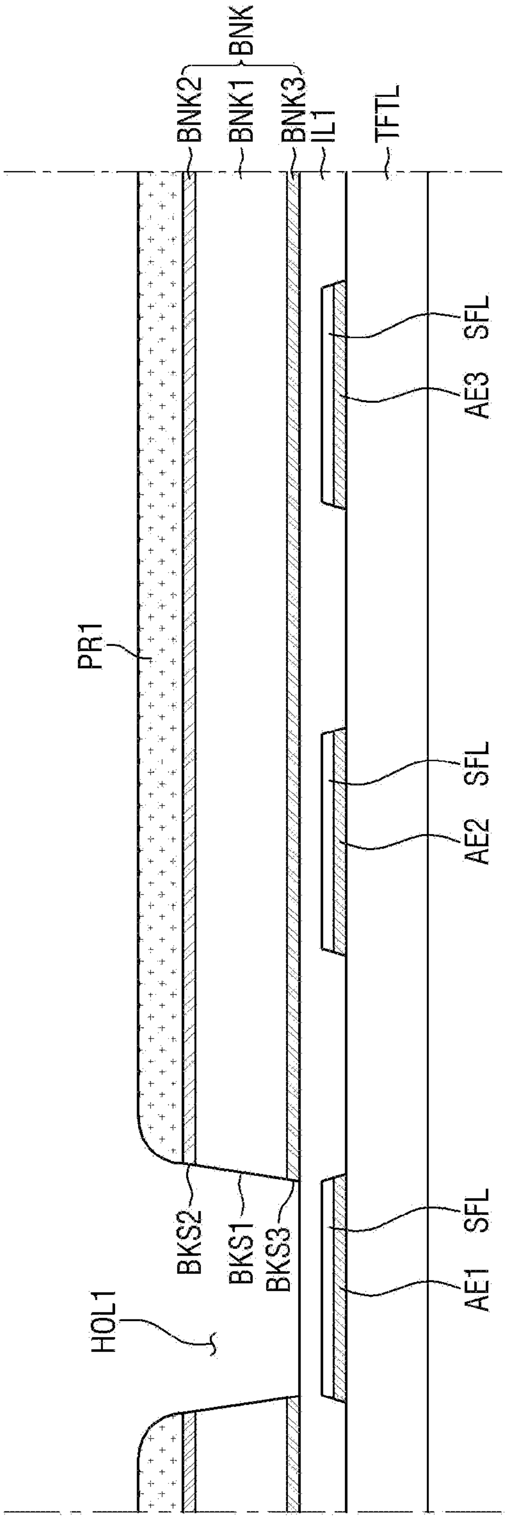
FIGS. 16 through 18 are cross-sectional views illustrating another example of how to fabricate the display device of FIG. 4.
Figure 17:
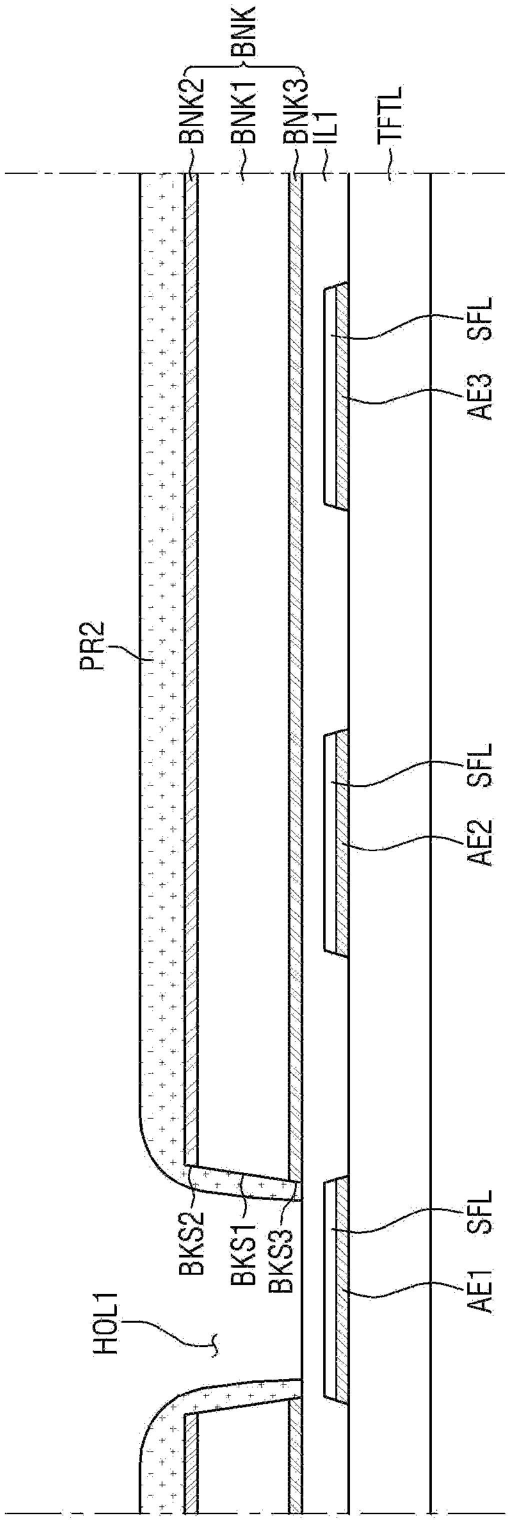
Figure 18:
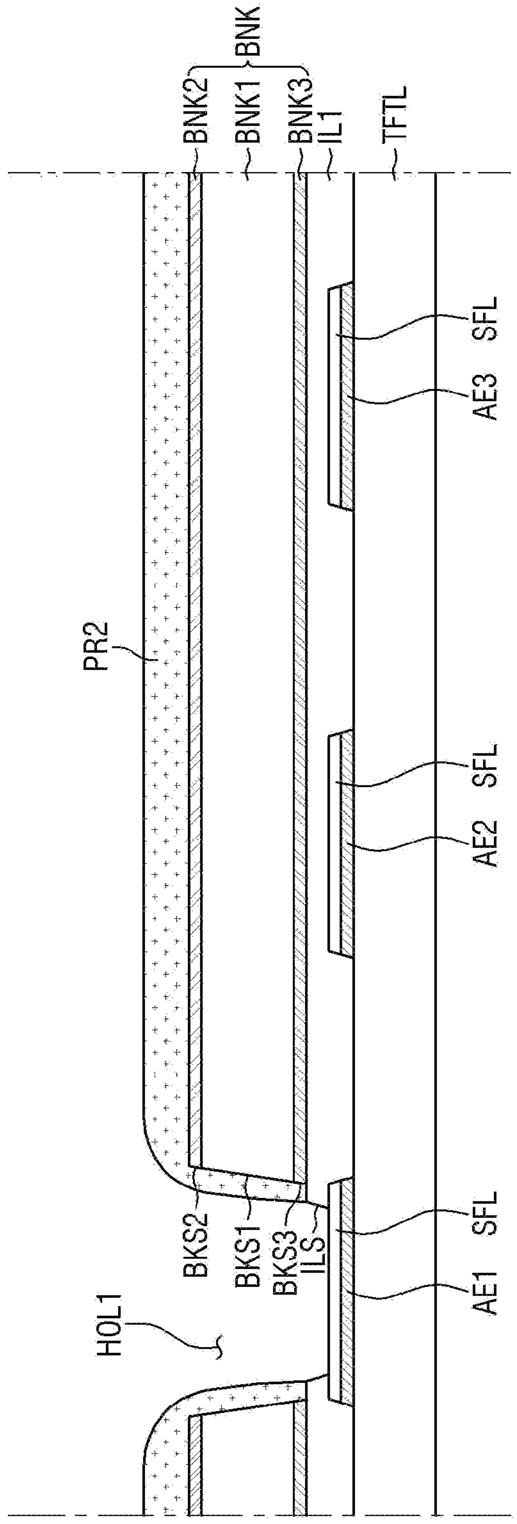

FIGS. 16 through 18 are cross-sectional views illustrating another example of how to fabricate the display device of FIG. 4. FIGS. 16 through 18 illustrate manufacturing processes that can replace the manufacturing processes described above with reference to FIGS. 7 through 9. For example, FIG. 16 illustrates a manufacturing process that can be performed after the manufacturing process of FIG. 16, and FIG. 18 illustrates a manufacturing process that can be performed before the manufacturing process of FIG. 10.

Referring to FIG. 16, a first photoresist PR1 may be disposed on the second bank BNK2 not to overlap with the first pixel electrode AE1 in a plan view. The first photoresist PR1 may be provided in the regions other than the region in which the first emission area EA1 is to be formed.

The second bank BNK2, the first bank BNK1, and the third bank BNK3 may be sequentially etched, thereby forming a first hole HOL1. The first hole HOL1 may overlap with the first emission area EA1. The first, second, and third banks BNK1, BNK2, and BNK3 may be etched by at least one of dry etching and wet etching. For example, the first, second, and third banks BNK1, BNK2, and BNK3 may be etched by dry etching, but the present disclosure is not limited thereto. In a dry etching process, the first, second, and third banks BNK1, BNK2, and BNK3 may have substantially the same etching rate. Thus, the second bank BNK2 may be etched earlier and by a greater amount than the first bank BNK1, and the first bank BNK1 may be etched earlier and by a greater amount than the third bank BNK3. The side surfaces BKS1 of the first bank BNK1, the side surfaces BKS2 of the second bank BNK2, and the side surfaces BKS3 of the third bank BNK3 may be connected to one another.

Referring to FIG. 17, the first insulating layer IL1 may be etched using a second is photoresist PR2, which is different from the first photoresist PR1. The second photoresist PR2 may further cover the side surfaces of each of the banks BNK, compared to the first photoresist PR1. The second photoresist PR2 may cover the side surfaces BKS1 of the first bank BNK1, the side surfaces BKS2 of the second bank BNK2, and the side surfaces BKS3 of the third bank BNK3. The second photoresist PR2 may cover both the side surfaces and the top surface of each of the banks BNK and may protect the side surfaces of each of the banks BNK. The second photoresist PR2 may have a larger planar area than the first photoresist PR1. For example, in a case where the first bank BNK1 includes aluminum (Al) and the first insulating layer IL1 is formed by dry etching, the second photoresist PR2 may prevent the first bank BNK1 from being plasma-oxidated. As the first insulating layer IL1 and the banks BNK are etched by separate etching processes, damage to the residual patterns RP can be controlled, and the display device 10 can include relatively thin residual patterns RP.

Referring to FIG. 18, the first insulating layer IL1 may be etched by at least one of dry etching and wet etching. For example, the first insulating layer IL1 may be etched by dry etching, but the present disclosure is not limited thereto. As the first insulating layer IL1 is etched, part of the top surface of the sacrificial layer SFL may be exposed.

The first insulating layer IL1 may have inclined side surfaces ILS. The first insulating layer IL1 may be etched from above, and the side surfaces ILS of the first insulating layer IL1 may face the top of the light-emitting element layer EML. The inclination angle of the side surfaces ILS of the first insulating layer IL1 may be determined by the inclination angle of the second photoresist PR2. For example, if the slope of side surfaces of the second photoresist PR2 is steep (e.g., almost perpendicular), the side surfaces ILS of the first insulating layer IL1 may have a steep slope. On the contrary, if the slope of the side surfaces of the second photoresist PR2 is gentle (e.g., almost flat), the side surfaces ILS of the first insulating layer IL1 may have a gentle slope. The side surfaces ILS of the first insulating layer IL1 may be spaced apart from the side surfaces of each of the banks BNK. The side surfaces ILS of the first insulating layer IL1 may be spaced apart from the side surfaces BKS1 of the first bank BNK1, the side surfaces BKS2 of the second bank BNK2, and the side surfaces BKS3 of the third bank BNK3.

The second photoresist PR2 may be removed by a strip process after the etching of the first insulating layer IL1. For example, after the removal of the second photoresist PR, the side surfaces BKS1 of the first bank BNK1 and the sacrificial layer SFL may be etched by wet etching, but the present disclosure is not limited thereto. At least one of the first, second, and third banks BNK1, BNK2, and BNK3 may include a different metal material from the other bank(s) BNK and may have a different etching rate from the other bank(s) BNK. In a wet etching process, the first bank BNK1 may be etched faster and by a greater amount than the second and third banks BNK2 and BNK3. Thus, the shapes of the side surfaces BKS1 of the first bank BNK1, the side surfaces BKS2 of the second bank BNK2, and the side surfaces BKS3 of the third bank BNK3 may be determined by the differences in etching rate between the first, second, and third banks BNK1, BNK2, and BNK3. The second bank BNK2 may include tips protruding from the first bank BNK1 toward the first hole HOL1. The side surfaces BKS1 of the first bank BNK1 may be inwardly recessed from the side surfaces BKS2 of the second bank BNK2 and the side surfaces BKS3 of the third bank BNK3. Undercuts may be formed below the tips of the second bank BNK2. The first bank BNK1 may be thicker than each of the second and third banks BNK2 and BNK3.

The first bank BNK1 may include a metal material with high electrical conductivity, and the second bank BNK2 may include a material with low reflectance. For example, the first bank BNK1 may include aluminum (Al), and the second and third banks BNK2 and BNK3 may include titanium (Ti). However, the present disclosure is not limited to this example.

As the sacrificial layer SFL is etched, at least part of the top surface of the first pixel electrode AE1 may be exposed. In a wet etching process, the sacrificial layer SFL may be etched by a greater amount than the first insulating layer IL1. As the sacrificial layer SFL is etched, the residual patterns RP may remain between the first insulating layer IL1 and the first pixel electrode AEL. Accordingly, the side surfaces of each of the residual patterns RP may be inwardly recessed from the side surfaces ILS of the first insulating layer IL1.

Figure 19:
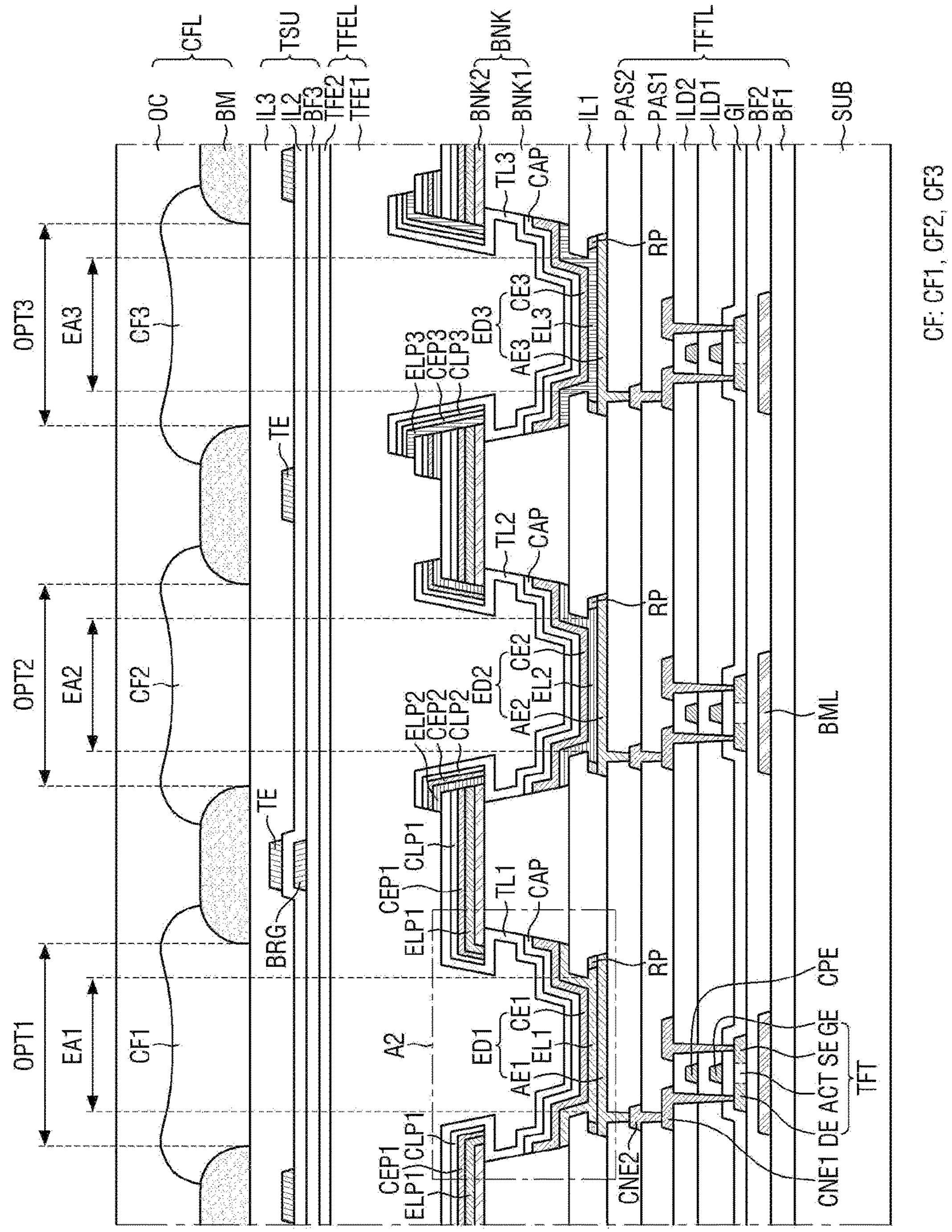
FIG. 19 is a cross-sectional view illustrating part of a display device according to another embodiment of the present disclosure.
Figure 20:
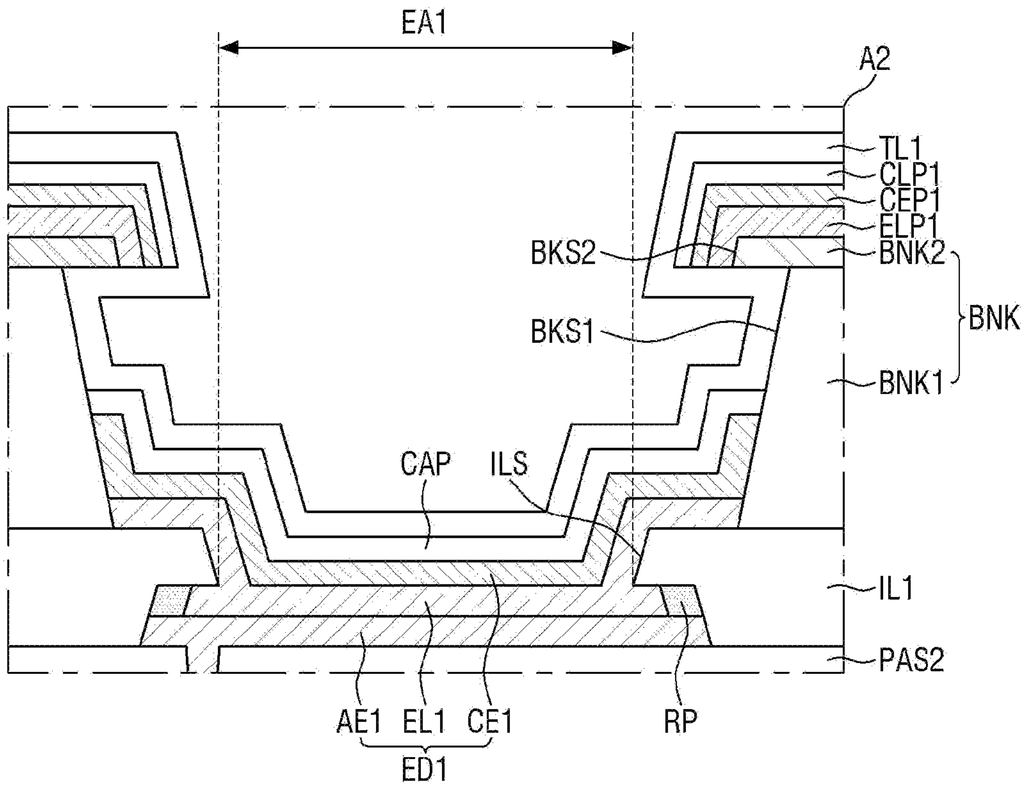
FIG. 20 is an enlarged cross-sectional view of an area A2 of FIG. 19.

FIG. 19 is a cross-sectional view illustrating part of a display device according to another embodiment of the present disclosure, and FIG. 20 is an enlarged cross-sectional view of an area A2 of FIG. 19. The display device of FIGS. 19 and 20 differs from the display device of FIGS. 4 and 5 in the structure of banks BNK and will hereinafter be described, focusing mainly on the differences with the display device of FIGS. 4 and 5.

Referring to FIGS. 19 and 20, a display panel 100 may include a display unit DU, a touch sensing unit TSU, and a color filter layer CFL. The display unit DU may include a substrate SUB, a TFT layer TFTL, a light-emitting element layer EML, and an encapsulation layer TFEL. The light-emitting element layer EML may include first, second, and third light-emitting elements ED1, ED2, and ED3, residual patterns RP, a first insulating layer IL1, a capping layer CAP, banks BNK, first, second, and third organic patterns ELP1, ELP2, and ELP3, first, second, and third electrode patterns CEP1, CEP2, and CEP3, first, second, and third capping patterns CLP1, CLP2, and CLP3, and first, second, and third inorganic layers TL1, TL2, and TL3.

The first insulating layer IL1 may be disposed on a second passivation layer PAS2 and the residual patterns RP. The first insulating layer IL1 may cover the edges of each of first, second, and third pixel electrodes AE1, AE2, and AE3 and the residual patterns RP and may expose parts of the top surfaces of the first, second, and third pixel electrodes AE1, AE2, and AE3. For example, the first insulating layer IL1 may expose the first pixel electrode AE1, in a first emission area EA1, and a first light-emitting layer EL1 may be disposed directly on the first pixel electrode AE1. The first insulating layer IL1 may include an inorganic insulating material. The first insulating layer IL1 may include at least one of a silicon nitride layer, a silicon oxynitride layer, a silicon oxide layer, a titanium oxide layer, an aluminum oxide layer, and an amorphous silicon layer, but the present disclosure is not limited thereto.

Referring to FIG. 20, the first insulating layer IL1 may have inclined side surfaces ILS. The first insulating layer IL1 may be etched from above, and the side surfaces ILS of the first insulating layer IL1 may face the top of the light-emitting element layer EML. The side surfaces ILS of the first insulating layer IL1 may be spaced apart from the side surfaces of each of the banks BNK. The side surfaces ILS of the first insulating layer IL1 may be spaced apart from side surfaces BKS1 of a first bank BNK1 and the side surfaces BKS2 of a second bank BNK2.

The first insulating layer IL1 and the banks BNK may be etched by separate etching processes. The first insulating layer IL1 and the banks BNK may be etched using different photoresists as masks. The banks BNK may be etched using a first photoresist as a mask, and the first insulating layer IL1 may be etched using a second photoresist as a mask. The first photoresist may cover the top surfaces of the banks BNK. The second photoresist may cover both the side surfaces and the top surface of each of the banks BNK and may protect the side surfaces of each of the banks BNK. The second photoresist may have a larger planar area than the first photoresist. For example, in a case where the first bank BNK1 includes aluminum (Al) and the first insulating layer IL1 is formed by dry etching, the second photoresist may prevent the first bank BNK1 from being plasma-oxidated. As the first insulating layer IL1 and the is banks BNK are etched by separate etching processes, damage to the residual patterns RP can be controlled, and relatively thin residual patterns RP can be provided.

As the display device includes the first insulating layer IL1 with the inclined side surfaces ILS and the relatively thin residual patterns RP, first, second, and third common electrodes CE1, CE2, and CE3 can be prevented from being short-circuited. For example, the first common electrode CE1 may be disposed directly on the first light-emitting layer EL1, in the first emission area EA1, and may extend to the side surfaces of each of the banks BNK to be in contact with the side surfaces BKS1 of the first bank BNK1. Thus, defects in the first, second, and third light-emitting elements ED1, ED2, and ED3 can be prevented, and reliability can be improved.

The banks BNK may be disposed on the first insulating layer IL1 and may define the first emission area EA1 and second and third emission areas EA2 and EA3. The banks BNK may surround the first, second, and third emission areas EA1, EA2, and EA3, in a plan view. The banks BNK may include the first and second banks BNK1 and BNK2.

The first bank BNK1 may be disposed on the first insulating layer IL1, and the second bank BNK2 may be disposed on the first bank BNK1. Referring to FIG. 20, the side surfaces BKS1 of the first bank BNK1 and the side surfaces BKS2 of the second bank BNK2 may be spaced apart from the side surfaces ILS of the first insulating layer IL1. The side surfaces BKS1 of the first bank BNK1 may be inwardly recessed from the side surfaces BKS2 of the second bank BNK2. The side surfaces BKS2 of the second bank BNK2 may protrude from the side surfaces BKS1 of the first bank BNK1 toward the first emission area EA1 and may thus include protruding tips. Thus, undercuts may be formed below the tips of the second bank BNK2. The first bank BNK1 may be thicker than the second bank BNK2.

The first and second banks BNK1 and BNK2 may include different metal materials. The first and second banks BNK1 and BNK2 may have different etching rates. For example, in a wet etching process, the first bank BNK1 may be etched faster and by a greater amount than the second bank BNK2 during the formation of the first, second, and third emission areas EA1, EA2, and EA3. Thus, the shapes of the side surfaces BKS1 of the first bank BNK1 and the side surfaces BKS2 of the second bank BNK2 may be determined by the differences in etching rate between the first and second banks BNK1 and BNK2. The first bank BNK1 may include a metal material with high electrical conductivity, and the second bank BNK2 may include a material with low reflectance. For example, the first bank BNK1 may include aluminum (Al), and the second and third banks BNK2 and BNK3 may include titanium (Ti). However, the present disclosure is not limited to this example.

The banks BNK may define openings therein, which form the first, second, and third emission areas EA1, EA2, and EA3, and may overlap with a light-blocking member BM of the color filter layer CFL in a plan view. The first bank BNK1 may electrically connect the first, second, and third common electrodes CE1, CE2, and CE3, which are spaced apart from one another. The second bank BNK2 may include a material with low reflectance and may thus be able to reduce the reflection of external light.

The banks BNK may form the first, second, and third emission areas EA1, EA2, and EA3 via a mask process, and the first light-emitting layer EL1 and second and third light-emitting layers EL2 and EL3 may be formed in the first, second, and third emission areas EA1, EA2, and EA3, respectively. A mask process may require a structure for mounting masks and an excessively large non-display area NDA for distribution control. If mask processes can be minimized, the structure for mounting masks may not be provided, and the size of the non-display area NDA for distribution control can be minimized.

FIGS. 21 through 26 are cross-sectional views illustrating an example of how to fabricate the display device of FIG. 19.

Figure 21:
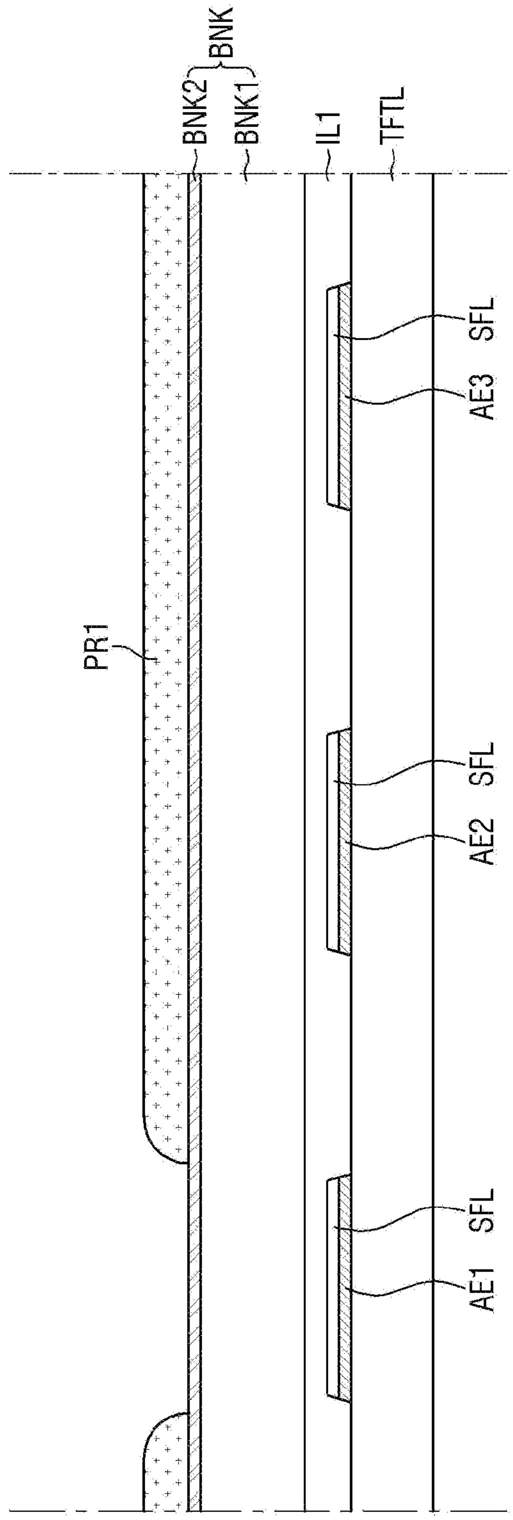
FIGS. 21 through 26 are cross-sectional views illustrating an example of how to fabricate the display device of FIG. 19.

Referring to FIG. 21, the first, second, and third pixel electrodes AE1, AE2, and AE3 may be disposed to be spaced apart from one another on the TFT layer TFTL. For example, the first, second, and third pixel electrodes AE1, AE2, and AE3 may include at least one of Ag, Cu, Al, Ni, and La. In another example, the first, second, and third pixel electrodes AE1, AE2, and AE3 may include ITO, IZO, or ITZO. In another example, the first, second, and third pixel electrodes AE1, AE2, and AE3 may have a stack structure such as ITO/Ag/ITO/, ITO/Ag/IZO, or ITO/Ag/ITZO/IZO.

A sacrificial layer SFL may be disposed on the first, second, and third pixel electrodes AE1, AE2, and AE3. The sacrificial layer SFL may be disposed between the top surfaces of the first, second, and third pixel electrodes AE1, AE2, and AE3 and the first insulating layer IL1. The sacrificial layer SFL may include an oxide semiconductor. For example, the sacrificial layer SFL may include at least one of indium gallium zinc oxide (IZO), zinc tin oxide (ZTO), and IZO.

The first insulating layer IL1 may be disposed on the TFT layer TFTL and the sacrificial layer SFL. The first insulating layer IL1 may include an inorganic insulating material. The first insulating layer IL1 may include at least one of a silicon nitride layer, a silicon oxynitride layer, a silicon oxide layer, a titanium oxide layer, an aluminum oxide layer, and an amorphous silicon layer, but the present disclosure is not limited thereto.

The first bank BNK1 may be disposed on the first insulating layer IL1, and the second bank BNK2 may be disposed on the first bank BNK1. The first bank BNK1 may be thicker than the second bank BNK2.

A first photoresist PR1 may be disposed on the second bank BNK2 not to overlap with the first pixel electrode AE1 in a plan view. The first photoresist PR1 may be provided in regions other than a region in which a first emission area EA1 is to be formed.

Figure 22:
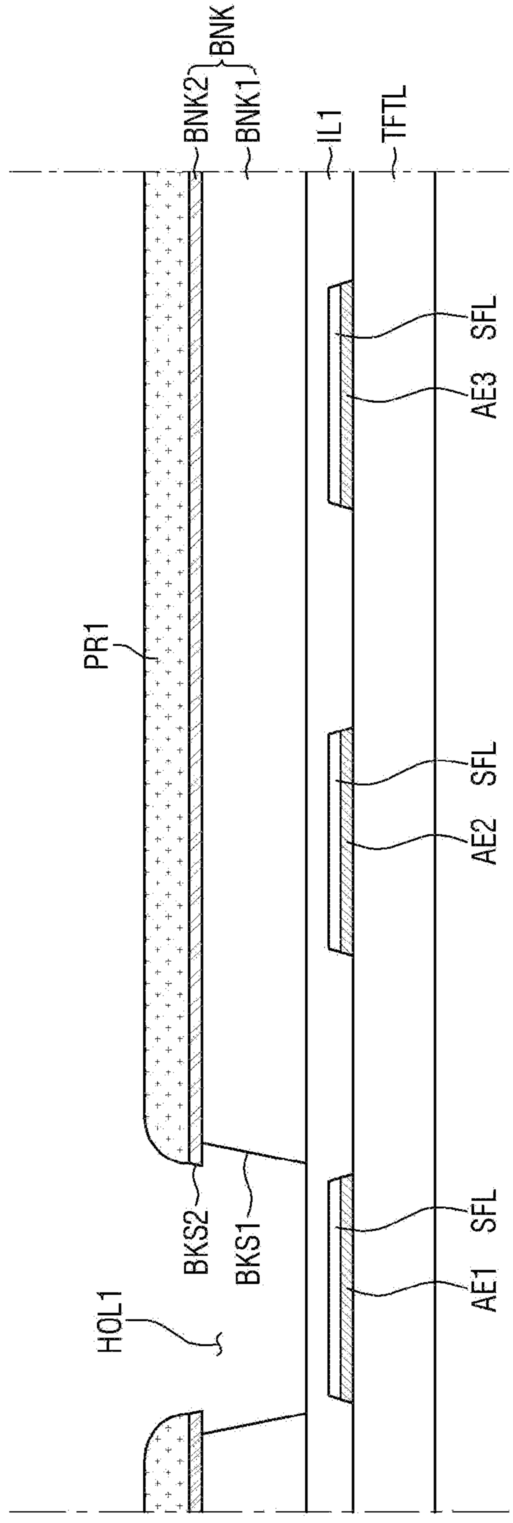

Referring to FIG. 22, the second bank BNK2 and then the first bank BNK1 may be etched, thereby forming a first hole HOL1. The first hole HOL1 may overlap with the first emission area EA1. The first and second banks BNK1 may be etched by at least one of dry etching and wet etching. For example, the first and second banks BNK1 and BNK2 may be etched primarily by dry etching and secondarily by wet etching, but the present disclosure is not limited thereto. The first and second banks BNK1 and BNK2 may include different metal materials and may have different etching rates. In a wet etching process, the first bank BNK1 may be etched faster and by a greater amount than the second bank BNK2. Thus, the shapes of the side surfaces BNK1 of the first bank BNK1 and the side surfaces BKS2 of the second bank BNK2 may be determined by the difference in etching rate between the first and second banks BNK1 and BNK2. The second bank BNK2 may include tips protruding from the first bank BNK1 toward the first hole HOL1. The side surfaces BKS1 of the first bank BNK1 may be inwardly recessed from the side surfaces BKS2 of the second bank BNK2. Undercuts may be formed below the tips of the second bank BNK2. The first bank BNK1 may be thicker than the second bank BNK2.

The first bank BNK1 may include a metal material with high electrical conductivity, and the second bank BNK2 may include a material with low reflectance. For example, the first bank BNK1 may include aluminum (Al), and the second and third banks BNK2 and BNK3 may include titanium (Ti). However, the present disclosure is not limited to this example.

Figure 23:
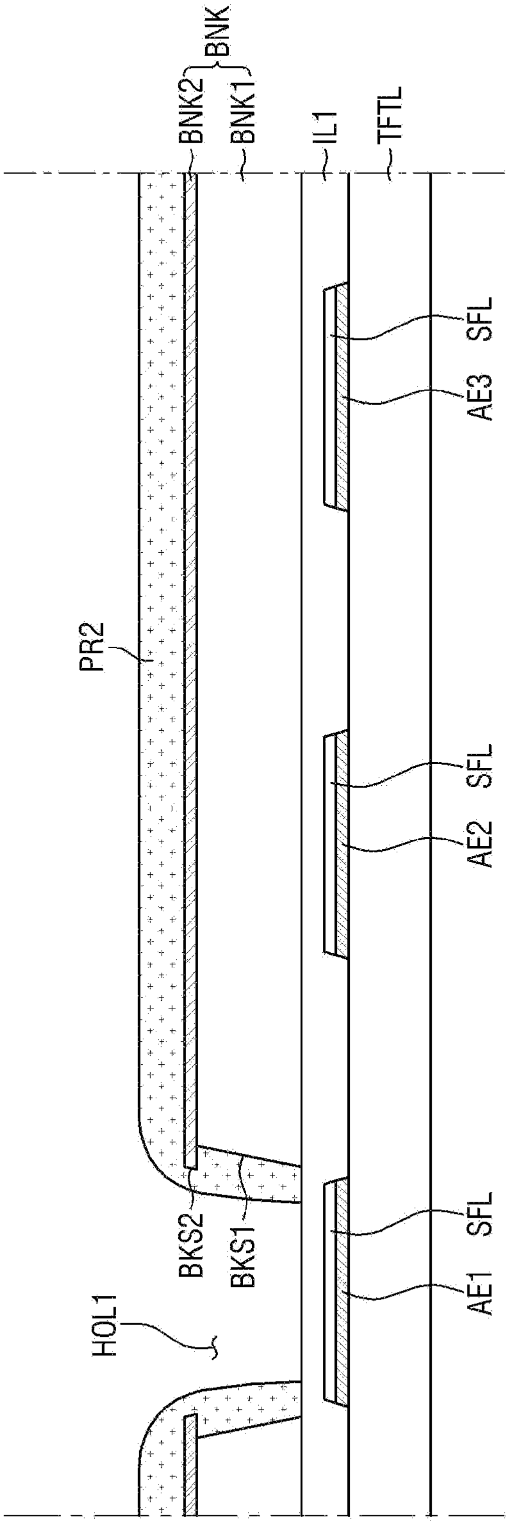

Referring to FIG. 23, the first insulating layer IL1 may be etched using a second photoresist PR2, which is different from the first photoresist PR1. The second photoresist PR2 may further cover the side surfaces of each of the banks BNK, compared to the first photoresist PR1. The second photoresist PR2 may cover the side surfaces BKS1 of the first bank BNK1 is and the side surfaces BKS2 of the second bank BNK2. The second photoresist PR2 may cover both the side surfaces and the top surface of each of the banks BNK and may protect the side surfaces of each of the banks BNK. The second photoresist PR2 may have a larger planar area than the first photoresist PR1. For example, in a case where the first bank BNK1 includes aluminum (Al) and the first insulating layer IL1 is formed by dry etching, the second photoresist PR2 may prevent the first bank BNK1 from being plasma-oxidated. As the first insulating layer IL1 and the banks BNK are etched by separate etching processes, damage to residual patterns RP can be controlled, and the display device can include relatively thin residual patterns RP.

Figure 24:
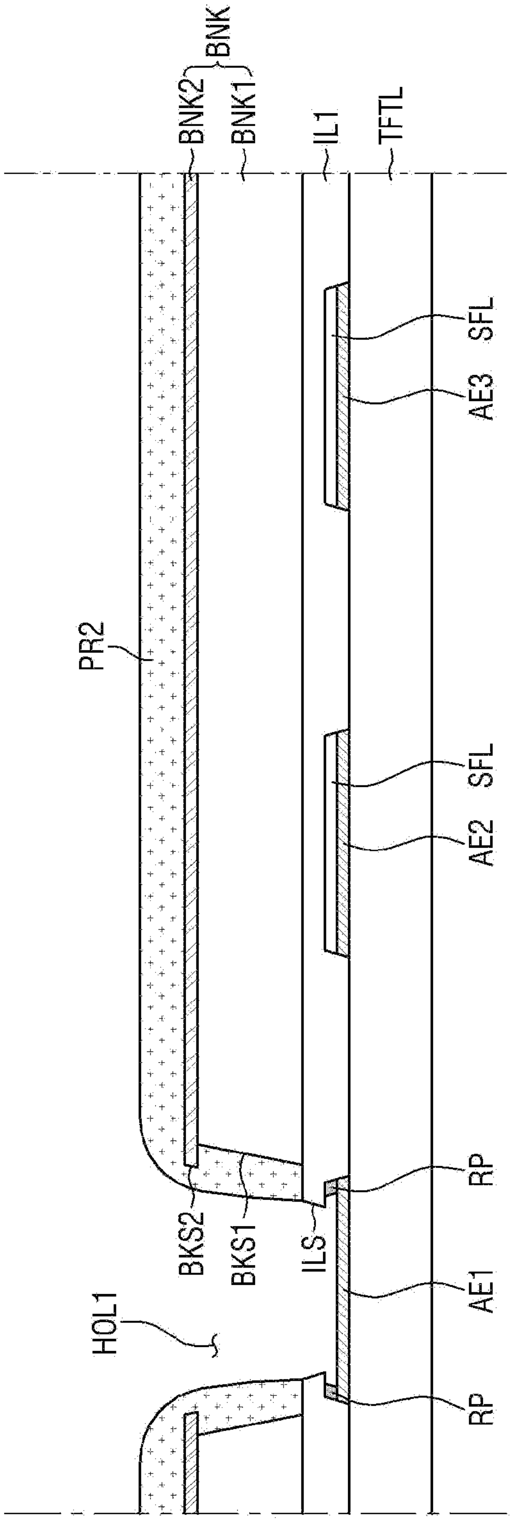

Referring to FIG. 24, the first insulating layer IL1 and the sacrificial layer SFL may be etched by at least one of dry etching and wet etching. For example, the first insulating layer IL1 may be etched by dry etching, and the sacrificial layer SFL may be etched by wet etching. However, the present disclosure is not limited to this example. As the first insulating layer IL1 and the sacrificial layer SFL are etched, at least part of the top surface of the first pixel electrode AE1 may be exposed. In a wet etching process, the sacrificial layer SFL may be etched by a greater amount than the first insulating layer IL. As the sacrificial layer SFL is etched, the residual patterns RP may remain between the first insulating layer IL1 and the first pixel electrode AE1. Accordingly, the side surfaces of each of the residual patterns RP may be inwardly recessed from the side surfaces ILS of the first insulating layer IL1.

The first insulating layer IL1 may have inclined side surfaces ILS. The first insulating layer IL1 may be etched from above, and the side surfaces ILS of the first insulating layer IL1 may face the top of a light-emitting element layer EML. The inclination angle of the side surfaces ILS of the first insulating layer IL1 may be determined by the inclination angle of the second photoresist PR2. For example, if the slope of side surfaces of the second photoresist PR2 is steep (e.g., almost perpendicular), the side surfaces ILS of the first insulating layer IL1 may have a steep slope. On the contrary, if the slope of the side surfaces of the second photoresist PR2 is gentle (e.g., almost flat), the side surfaces ILS of the first insulating layer IL1 may have a gentle slope. The side surfaces ILS of the first insulating layer IL1 may be spaced apart from the side surfaces of each of the banks BNK. The side surfaces ILS of the first insulating layer IL1 may be spaced apart from the side surfaces BKS1 of the first bank BNK1 and the side surfaces BKS2 of the second bank BNK2.

Figure 25:
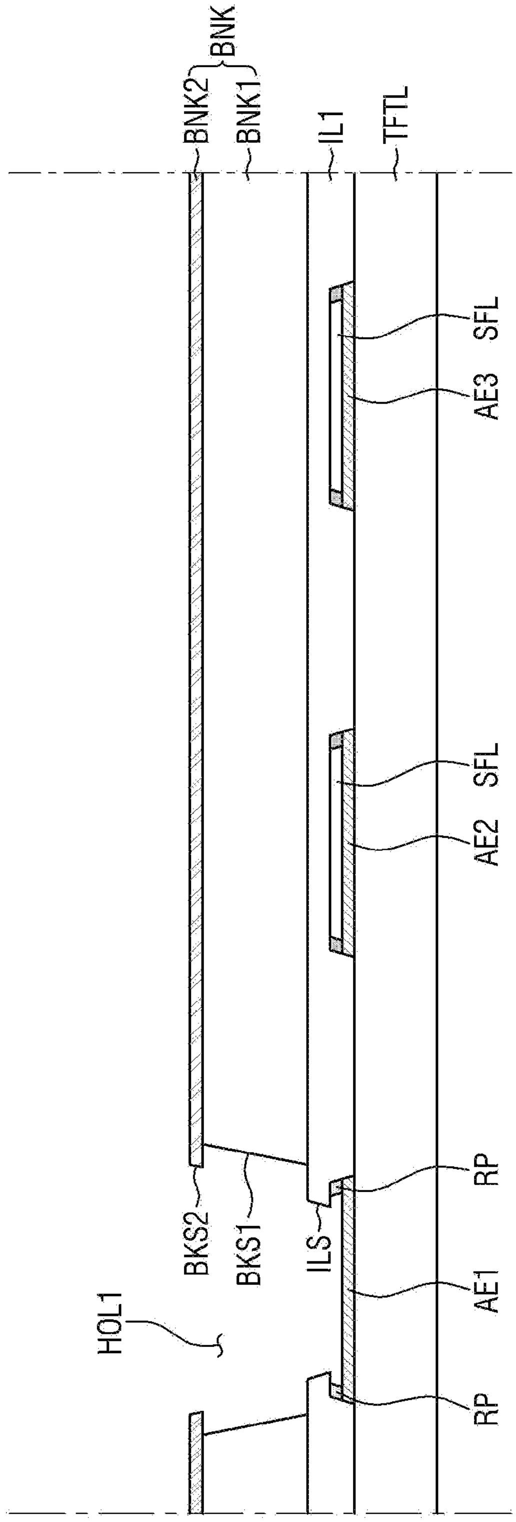

Referring to FIG. 25, the second photoresist PR may be removed by a strip process after the etching of the first insulating layer IL1 and the sacrificial layer SFL.

Figure 26:
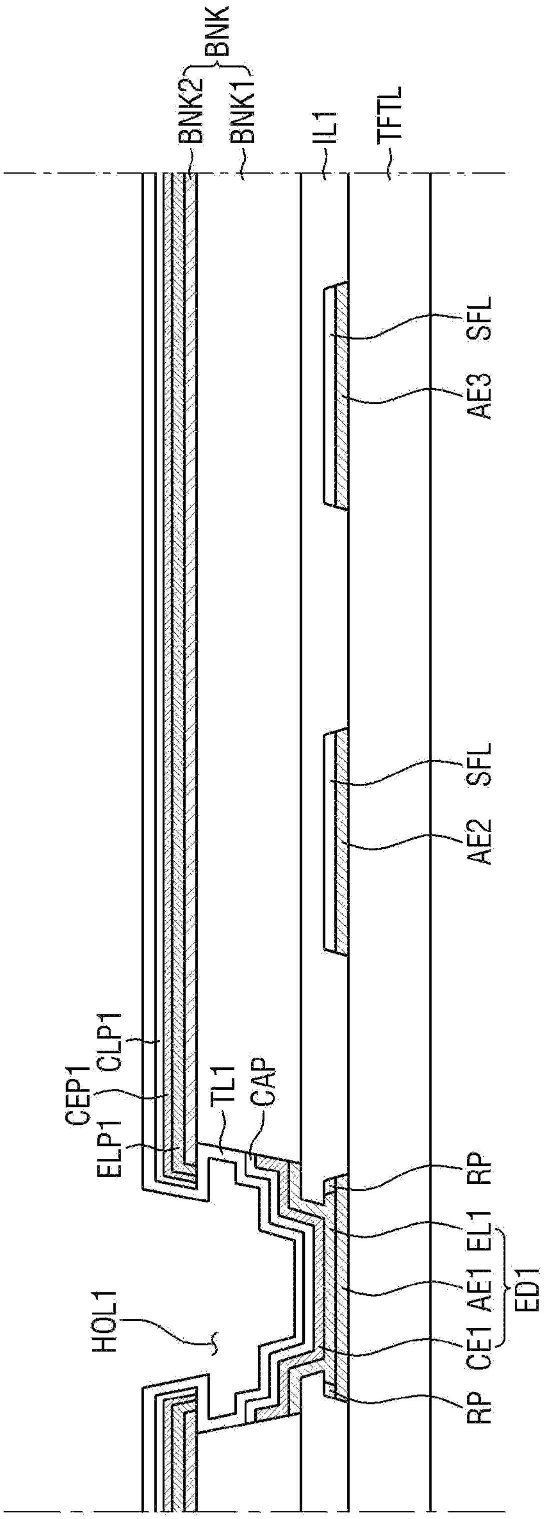

Referring to FIG. 26, a first light-emitting layer EL1 may be disposed directly on the first pixel electrode AE1, in the first emission area EA1. Part of the first light-emitting layer EL1 may fill the space surrounded by the first pixel electrode AE1, the residual patterns RP, and the first insulating layer IL1, and another part of the first light-emitting layer EL1 may cover part of the top surface of the first insulating layer IL1 and some of the side surfaces ILS of the first insulating layer IL1.

An organic material for forming the first light-emitting layer EL1 and the first organic pattern ELP1 may be deposited on the entire surface of the display device. The first light-emitting layer EL1 and the first organic pattern ELP1 may be deposited by the same process and may be cut and separated from each other by the tips formed on the inner sidewalls of each of the banks BNK. The first organic pattern ELP1 may be disposed on the second bank BNK2, in areas other than the first emission area EA1.

The first common electrode CE1 may be disposed on the first light-emitting layer EL1. The first common electrode CE1 may include a transparent conductive material and may transmit light generated by the first light-emitting layer EL1 therethrough. The first common electrode CE1 may be in contact with the side surfaces BKS1 of the first bank BNK1 and upper surface and the third bank BNK3. Thus, the first light-emitting element ED1 may be formed in the first hole HOL1 and may emit light through the first emission area EA1.

A metal material for forming the first common electrode CE1 and the first electrode pattern CEP1 may be deposited on the entire surface of the display device. The first common electrode CE1 and the first electrode pattern CEP1 may be deposited by the same process and may be cut by the tips formed on the inner sidewalls of each of the banks BNK. The first electrode pattern CEP1 may be disposed on the first organic pattern ELP1, in the areas other than the first emission area EA1.

The capping layer CAP may be disposed on the first common electrode CE1. The capping layer CAP may include an inorganic insulating material and may cover the first light-emitting element ED1. The capping layer CAP may prevent the first common electrode CE1 from being damaged by external air.

An inorganic material for forming the capping layer CAP and the first capping pattern CLP1 may be deposited on the entire surface of the display device. The capping layer CAP and the first capping pattern CLP1 may be deposited by the same process and may be cut by the tips formed on the inner sidewalls of each of the banks BNK. The first capping pattern CLP1 may be disposed on the first electrode pattern CEP1, in the areas other than the first emission area EA1.

The first inorganic layer TL1 may be disposed on part of the capping layer CAP in the first emission area EA1 and on the first capping pattern CLP1. The first inorganic layer TL1 may cover side surfaces BKS1 of parts of the first bank BNK1 that surround the first emission area EA1. The first inorganic layer TL1 may include an inorganic material and may prevent oxygen or moisture from penetrating the first light-emitting element ED1.

Figure 27:
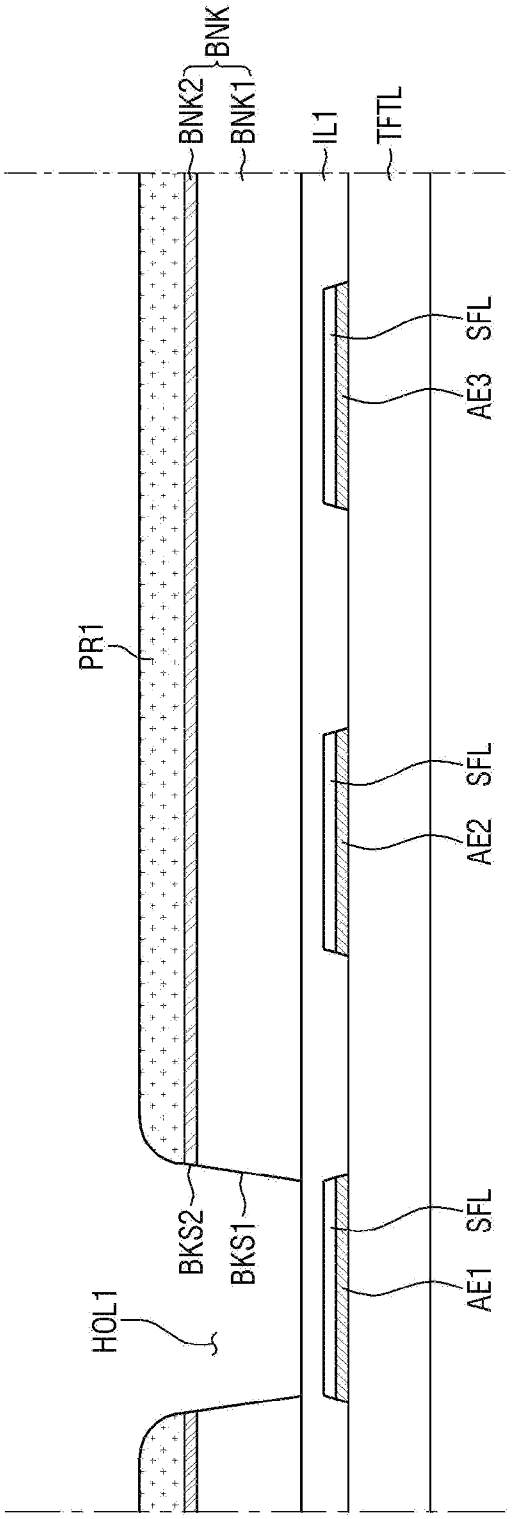
FIGS. 27 through 29 are cross-sectional views illustrating another example of how to fabricate the display device of FIG. 19.
Figure 28:
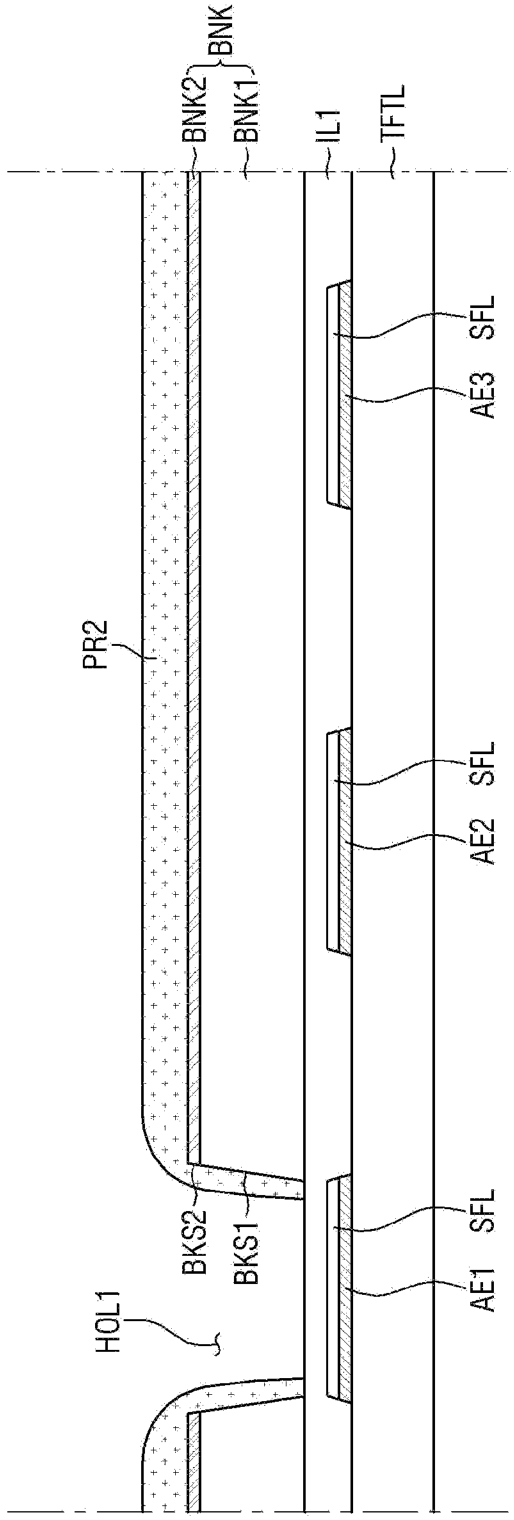
Figure 29:
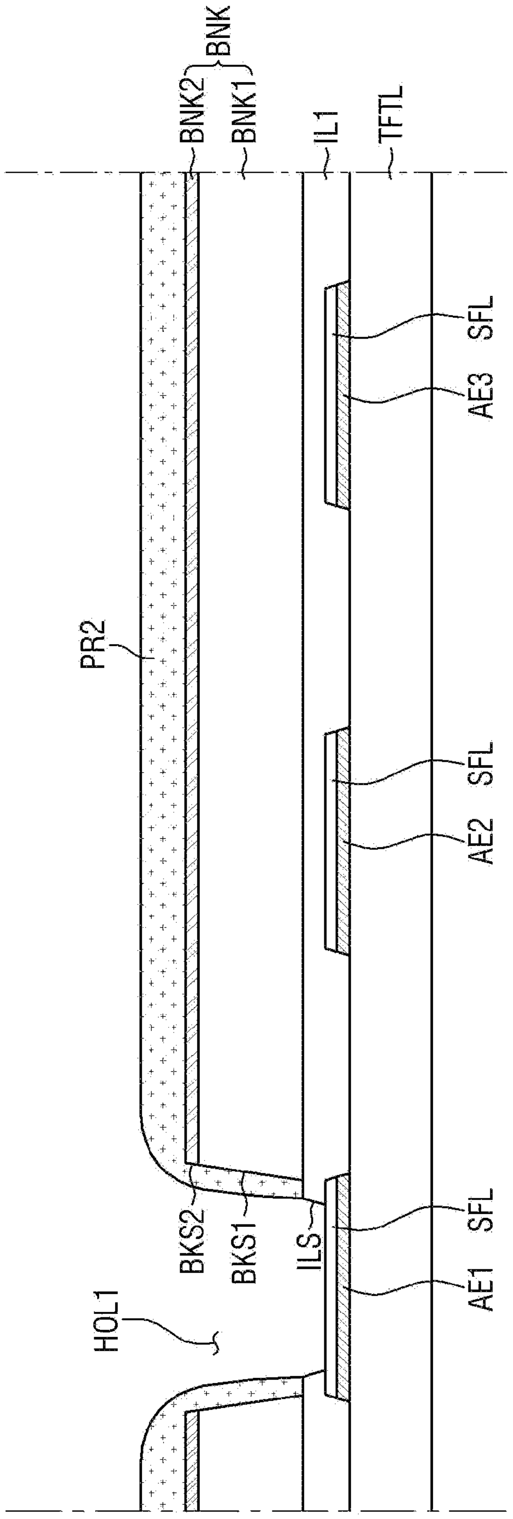

FIGS. 27 through 29 are cross-sectional views illustrating another example of how to fabricate the display device of FIG. 19. FIGS. 27 through 29 illustrate manufacturing processes that can replace the manufacturing processes described above with reference to FIGS. 22 through 29. For example, FIG. 27 illustrates a manufacturing process that can be performed after the manufacturing process of FIG. 21, and FIG. 29 illustrates a manufacturing process that can be performed before the manufacturing process of FIG. 25.

Referring to FIG. 27, a first photoresist PR1 may be disposed on the second bank BNK2 not to overlap with the first pixel electrode AE1 in a plan view. The first photoresist PR1 may be provided in regions other than a region in which the first emission area EA1 is to be formed.

The second bank BNK2 and then the first bank BNK1 may be sequentially etched, thereby forming a first hole HOL1. The first hole HOL1 may overlap with the first emission area EA1. The first and second banks BNK1 and BNK2 may be etched by at least one of dry etching and wet etching. For example, the first and second banks BNK1 and BNK2 may be etched by dry etching, but the present disclosure is not limited thereto. In a dry etching process, the first and second banks BNK1 and BNK2 may have substantially the same etching rate. Thus, the second bank BNK2 may be etched earlier and by a greater amount than the first bank BNK1. The side surfaces BKS1 of the first bank BNK1 and the side surfaces BKS2 of the second bank BNK2 may be connected to one another.

Referring to FIG. 28, the first insulating layer IL1 may be etched using a second photoresist PR2, which is different from the first photoresist PR1. The second photoresist PR2 may further cover the side surfaces of each of the banks BNK, compared to the first photoresist PR1. The second photoresist PR2 may cover the side surfaces BKS1 of the first bank BNK1 and the side surfaces BKS2 of the second bank BNK2. The second photoresist PR2 may cover both the side surfaces and the top surface of each of the banks BNK and may protect the side surfaces of each of the banks BNK. The second photoresist PR2 may have a larger planar area than the first photoresist PR1. For example, in a case where the first bank BNK1 includes aluminum (Al) and the first insulating layer IL1 is formed by dry etching, the second photoresist PR2 may prevent the first bank BNK1 from being plasma-oxidated. As the first insulating layer IL1 and the banks BNK are etched by separate etching processes, damage to the residual patterns RP can be controlled, and relatively thin residual patterns RP can be provided.

Referring to FIG. 29, the first insulating layer IL1 may be etched by at least one of dry etching and wet etching. For example, the first insulating layer IL1 may be etched by dry etching, but the present disclosure is not limited thereto. As the first insulating layer IL1 is etched, part of the top surface of the sacrificial layer SFL may be exposed.

The first insulating layer IL1 may have inclined side surfaces ILS. The first insulating layer IL1 may be etched from above, and the side surfaces ILS of the first insulating layer IL1 may face the top of the light-emitting element layer EML. The inclination angle of the side surfaces ILS of the first insulating layer IL1 may be determined by the inclination angle of the second photoresist PR2. For example, if the slope of side surfaces of the second photoresist PR2 is steep (e.g., almost perpendicular), the side surfaces ILS of the first insulating layer IL1 may have a steep slope. On the contrary, if the slope of the side surfaces of the second photoresist PR2 is gentle (e.g., almost flat), the side surfaces ILS of the first insulating layer IL1 may have a gentle slope. The side surfaces ILS of the first insulating layer IL1 may be spaced apart from the side surfaces of each of the banks BNK. The side surfaces ILS of the first insulating layer IL1 may be spaced apart from the side surfaces BKS1 of the first bank BNK1 and the side surfaces BKS2 of the second bank BNK2.

The second photoresist PR2 may be removed by a strip process after the etching of the first insulating layer IL1. For example, after the removal of the second photoresist PR, the side surfaces BKS1 of the first bank BNK1 and the sacrificial layer SFL may be etched by wet etching, but the present disclosure is not limited thereto. The first and second banks BNK1 and BNK2 may include different metal materials and may have different etching rates. In a wet etching process, the first bank BNK1 may be etched faster and by a greater amount than the second bank BNK2. Thus, the shapes of the side surfaces BKS1 of the first bank BNK1 and the side surfaces BKS2 of the second bank BNK2 may be determined by the differences in etching rate between the first, second, and third banks BNK1, BNK2, and BNK3. The second bank BNK2 may include tips protruding from the first bank BNK1 toward the first hole HOL1. The side surfaces BKS1 of the first bank BNK1 may be inwardly recessed from the side surfaces BKS2 of the second bank BNK2. Undercuts may be formed below the tips of the second bank BNK2. The first bank BNK1 may be thicker than the second or third bank BNK2 or BNK3.

The first bank BNK1 may include a metal material with high electrical conductivity, and the second bank BNK2 may include a material with low reflectance. For example, the first bank BNK1 may include aluminum (Al), and the second and third banks BNK2 and BNK3 may include titanium (Ti). However, the present disclosure is not limited to this example.

As the sacrificial layer SFL is etched, at least part of the top surface of the first pixel electrode AE1 may be exposed. In a wet etching process, the sacrificial layer SFL may be etched by a greater amount than the first insulating layer IL1. As the sacrificial layer SFL is etched, the residual patterns RP may remain between the first insulating layer IL1 and the first pixel electrode AEL. Accordingly, the side surfaces of each of the residual patterns RP may be inwardly recessed from the side surfaces ILS of the first insulating layer IL1.

What is claimed is:

1. A display device comprising:
- a first pixel electrode disposed in a first emission area, on a substrate;
- an insulating layer covering edges of the first pixel electrode;
- a first light-emitting layer disposed on the first pixel electrode and the insulating layer;
- a first common electrode disposed on the first light-emitting layer;
- banks disposed on the insulating layer and surrounding the first emission area;
- a residual pattern positioned between the first pixel electrode and the insulating layer in a direction perpendicular to one surface of the substrate; and
- an organic pattern surrounding the first emission area, disposed on the banks, and including a same material as the first light-emitting layer,
- wherein side surfaces of each of the banks are spaced apart from side surfaces of the insulating layer, and
- wherein the residual pattern is a display device in contact with the first pixel electrode and the insulating layer.

2. The display device of claim 1, wherein the banks comprise:
- a first bank disposed on the insulating layer and including a metal material;
- a second bank disposed on the first bank;
- a third bank disposed between the first bank and the insulating layer, and
- the thickness of the residual pattern is thinner than that of the insulating layer,
- a side surface of the residual pattern protrudes in a direction toward the first light emission area rather than the side surfaces of each of the banks.

3. The display device of claim 2, wherein the side surfaces of the first bank are inwardly recessed from the side surfaces of the second bank and the side surfaces of the third bank.

4. The display device of claim 2, wherein the second bank includes tips protruding from the side surfaces of the first bank toward the first emission area.

5. The display device of claim 2, wherein the first common electrode extends to the side surfaces of each of the banks and is in contact with the side surfaces of the first bank and a top surface of the third bank.

6. The display device of claim 2, further comprising:
- a second pixel electrode disposed in a second emission area, on the substrate;

a second light-emitting layer disposed on the second pixel electrode; and a second common electrode disposed on the second light-emitting layer.

7. The display device of claim 6, wherein the first and second common electrodes are electrically connected through the first bank and third bank.

8. The display device of claim 1, wherein the banks comprise:

a first bank disposed on the insulating layer and including a metal material; and a second bank disposed on the first bank.

9. The display device of claim 8, wherein the side surfaces of the first bank are inwardly recessed from the side surfaces of the second bank.

10. The display device of claim 8, further comprising:

a second pixel electrode disposed in a second emission area, on the substrate;

a second light-emitting layer disposed on the second pixel electrode; and a second common electrode disposed on the second light-emitting layer, wherein the first and second common electrodes are electrically connected through the first bank.

* * * * *